United States Patent
Parashar et al.

(10) Patent No.: US 10,291,029 B2
(45) Date of Patent: May 14, 2019

(54) ENHANCED ISLAND MANAGEMENT APPLICATION FOR POWER GRID SYSTEMS

(71) Applicant: General Electric Technology GmbH, Baden (CH)

(72) Inventors: Manu Parashar, Seattle, WA (US); Anil Jampala, Bothell, WA (US); Jay Giri, Redmond, WA (US); Saugata Swapan Biswas, Kirkland, WA (US)

(73) Assignee: GENERAL ELECTRIC TECHNOLOGY GMBH, Baden (CH)

( * ) Notice: Subject to any disclaimer, the term of this patent is extended or adjusted under 35 U.S.C. 154(b) by 0 days.

(21) Appl. No.: 15/679,056

(22) Filed: Aug. 16, 2017

(65) Prior Publication Data

US 2018/0054063 A1 Feb. 22, 2018

Related U.S. Application Data

(60) Provisional application No. 62/376,898, filed on Aug. 18, 2016.

(51) Int. Cl.
*G08B 21/00* (2006.01)
*H02J 3/38* (2006.01)
(Continued)

(52) U.S. Cl.
CPC ............ *H02J 3/382* (2013.01); *G01R 31/086* (2013.01); *G01R 31/088* (2013.01); *G08B 21/18* (2013.01);
(Continued)

(58) Field of Classification Search
CPC .................................. G01R 1/00; Y04S 10/00
See application file for complete search history.

(56) References Cited

U.S. PATENT DOCUMENTS 8,924,033 B2 12/2014 Goutard et al.
2007/0219755 A1* 9/2007 Williams .................. H02J 3/32
702/188
(Continued)

FOREIGN PATENT DOCUMENTS

WO 2012/032111 A2 3/2012

OTHER PUBLICATIONS

Cardenas, J., et al., "Islanding detection with Phasor Measurement Units," 67th Annual Conference for Protective Relay Engineers, pp. 229-241 (Mar. 31-Apr. 3, 2014).
(Continued)

*Primary Examiner* — Shirley Lu
(74) *Attorney, Agent, or Firm* — Amin, Turocy & Watson, LLP

(57) ABSTRACT

The technology is generally directed towards real-time power grid island detection and monitoring, including obtaining and outputting information about the cause and location of the islanding event, island size, island composition, phasor measurement units in each island, and the overall island frequency. The technology provides for suggested island resynchronization actions such as one or more circuit breakers that can be closed by the power grid system operators to resynchronize an island with the main island/system. An application program may output the information and also assist the operators during the resynchronization process by providing real time information about the voltage difference and frequency difference across each proposed circuit breaker in the suggested restoration point. Real-time tracking of the island resynchronization actions is also described.

20 Claims, 18 Drawing Sheets

(51) Int. Cl.
  *G01R 31/08*  (2006.01)
  *G08B 21/18*  (2006.01)
  *H02J 13/00*  (2006.01)
(52) U.S. Cl.
  CPC .............. *H02J 3/38* (2013.01); *H02J 13/001* (2013.01); *H02J 2003/388* (2013.01); *Y02E 40/72* (2013.01); *Y04S 10/12* (2013.01); *Y04S 10/40* (2013.01)

(56) References Cited

U.S. PATENT DOCUMENTS

2013/0036311 A1*  2/2013  Akyol ..................... H04L 63/08
                                                         713/189
2013/0346057 A1* 12/2013  Lin ........................ H02J 3/00
                                                         703/18

OTHER PUBLICATIONS

Madani, V., et al., "Advanced EMS applications using synchrophasor systems for grid operation," IEEE/PES Transmission & Distribution Conference & Exposition (T&D), pp. 1-6 (Apr. 14-17, 2014).
Shi, D. S., et al., "Active synchronization control for microgrid reconnection after islanding," 5th IEEE PES Innovative Smart Grid Technologies Europe (ISGT Europe), pp. 1-5 (Oct. 12-15, 2014).
International Search Report and Written Opinion issued in connection with corresponding PCT Application No. PCT/EP2017/070969, dated Oct. 27, 2017.

* cited by examiner

FIG. 10

Summary of Stations in the Island:

| ISLAND | ST ID DIV / CO | STN MULT ISLANDS | MW GEN IN ST | % GEN SHARE OF ST IN ISLAND | MW LOAD IN ST | % LOAD SHARE OF ST IN ISLAND | PMU AVAILABILITY | FREQUENCY (Hz) |
|---|---|---|---|---|---|---|---|---|
| 1 | ARIZONA3 Div:UTAH Co:UTAH | ○ No | 9022.90 E | % Gen Share: 20.5% 0% — 100% | 7353.04 E | % Load Share: 16.9% 0% — 100% | ○ PMU Info | 59.97 P |
| 1 | ARIZONA1 Div:UTAH Co:UTAH | ○ No | 5898.88 E | % Gen Share: 13.4% 0% — 100% | 3387.58 E | % Load Share: 7.8% 0% — 100% | ○ PMU Info | 59.97 P |
| 1 | WYOMING1 Div:UTAH Co:UTAH | ○ No | 5790.54 E | % Gen Share: 13.1% 0% — 100% | 4035.21 E | % Load Share: 9.3% 0% — 100% | ○ PMU Info | 59.97 P |
| 1 | COLORAD1 Div:UTAH Co:UTAH | ○ No | 4350.02 E | % Gen Share: 9.9% 0% — 100% | 3860.85 E | % Load Share: 8.9% 0% — 100% | ⊗ No | Data Unavailable |
| 1 | N_CA4 Div:CALI Co:CALIFO | ○ No | 2790.65 E | % Gen Share: 6.3% 0% — 100% | 0.00 E | % Load Share: 0.0% 0% — 100% | ○ PMU Info | 59.97 P |
| 1 | SPOKANE1 Div:NORT Co:NORTWE | ○ No | 2270.92 E | % Gen Share: 5.2% 0% — 100% | -273.99 E | % Load Share: -0.6% 0% — 100% | ○ PMU Info | 59.97 P |
| 1 | PORTLAN1 Div:NORT Co:NORTWE | ○ No | 1861.92 E | % Gen Share: 4.2% 0% — 100% | 4558.29 E | % Load Share: 10.5% 0% — 100% | ○ PMU Info | 59.97 P |
| 1 | PORTLAN3 | ○ | 1759.29 | % Gen Share: 4.0% 0% — 100% | 572.90 | % Load Share: 1.3% 0% — 100% | ○ | 59.97 |

Summary of Island Interfaces for Resynchronization:

| FROM ISLAND | TO ISLAND | ISLAND INTERFACES EQUIP | CB | CB OPEN CAUSING ISLAND FORMATION | SYNC-CHECK RELAY WITH CB | VOLTAGE DIFF ACROSS ISLANDS (KV) | FREQ DIFF ACROSS ISLANDS (Hz) |
|---|---|---|---|---|---|---|---|
| 1 | 3 | CANADA3 | LN:6_28_1 | CB:6_28_1 | ⊘ N/A | ⊗ No | 0.21 [S] | -0.13 [S] |
| 1 | 3 | CANADA8 | LN:7_10_1 | CB:7_10_1 | ⊘ N/A | ○ Yes | 0.31 [S] | -0.13 [S] |
| 1 | 2 | CANADA4 | LN:77_102_1 | CB:77_102_1 | ⊘ N/A | ⊗ No | 0.06 [S] | Data Unavailable [S] |
| 1 | 2 | CANADA4 | LN:77_111_1 | CB:277_111_ | ⊘ N/A | ⊗ No | 0.02 [S] | Data Unavailable [S] |

FIG. 12

ENHANCED ISLAND MANAGEMENT APPLICATION FOR POWER GRID SYSTEMS

RELATED APPLICATION

This application claims priority to U.S. Provisional Patent Application No. 62/376,898, filed Aug. 18, 2016, and entitled "Enhanced Island Management (EIM) Application", the entirety of which application is hereby incorporated herein by reference.

TECHNICAL FIELD

The disclosed subject matter relates to managing a power grid system.

BACKGROUND

A power grid is a complex and dynamic system that is difficult to manage. Among the power grid issues to be managed is an island condition in the power grid system in which one or more parts of the grid become segregated from the main grid.

In general, an island condition occurs when an islanding event causes a change in topology. One type of topology change is a branch topology change, which occurs, for example, when a line and transformer trips due to the opening of a circuit breaker at one end (or possibly both ends) of a component. Another type of topology change is a bus topology change, which occurs, for example, when a bus splits due to the opening of a circuit breaker connecting two buses.

When an island condition occurs, an island resynchronization action (or set of actions) needs to be performed by power system operator(s) to couple the segregated grid or grids back to the main grid. This can be a complicated task, with many options available to the power system operator(s). In addition, as an island is resynchronized, status information and other data change as a result of the resynchronization transition.

The above-described background relating to power grid systems is merely intended to provide a contextual overview of some current issues, and is not intended to be exhaustive. Other contextual information may become further apparent upon review of the following detailed description.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

Briefly, one or more aspects of the technology described herein are directed towards detecting a change in power grid topology that results from an islanding event in a power grid that segregates the power grid into a main grid and one or more islands. In response to the detecting the change in the power grid topology, aspects include determining the composition of each island of the one or more islands, obtaining voltage data, real power data, and frequency data for each island of the one or more islands, and identifying at least one island resynchronization point, if available, based on the composition of each island, the voltage data, the real power data, and/or the frequency data. Other aspects may include outputting information corresponding to each island resynchronization point.

Other embodiments and details may become apparent from the following detailed description when taken in conjunction with the drawings.

BRIEF DESCRIPTION OF THE DRAWINGS

The technology described herein is illustrated by way of example and not limited in the accompanying figures in which like reference numerals indicate similar elements and in which:

FIGS. 9-13 are representations of examples screenshots of an island management application program in accordance with aspects of the subject disclosure.

DETAILED DESCRIPTION

Figure 1:
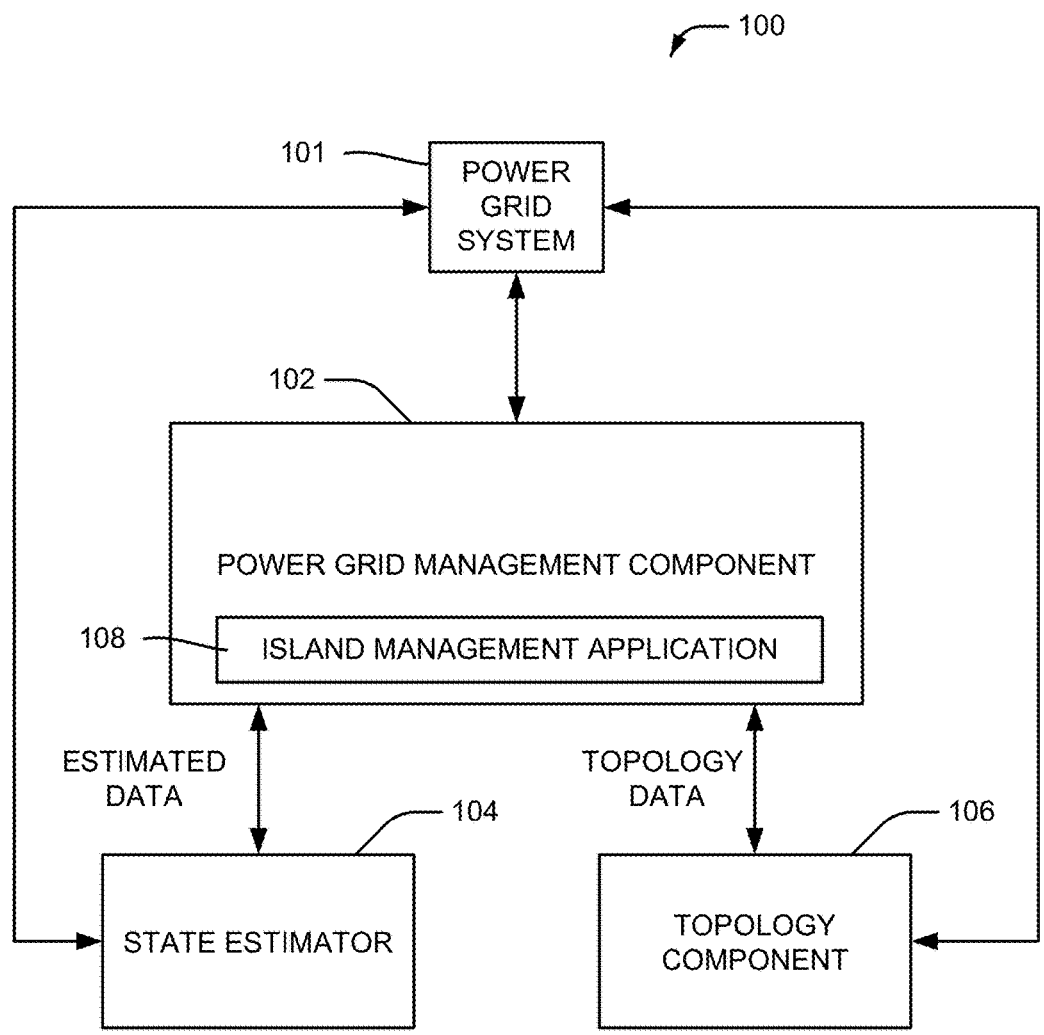
FIG. 1 illustrates a system that facilitates managing energy flow in a power grid system in accordance with aspects of the subject disclosure.

Various aspects of the technology described herein are generally directed towards assisting operators in the resynchronizing of one or more power grid islands to a main power grid. In one aspect, an enhanced island management application program assists operators with the resynchronization actions that can be taken.

In general and as described herein, the island management application program leverages topology information along with phasor measurement unit (PMU) data and possibly other information, such as state estimator data, to determine an islanding event, provide in-depth, real-time wide area visibility to power system operators at the control center about system islanding events, propose restoration actions for resynchronization of the formed islands, and track the performed restoration actions in real time. Note that PMUs comprise grid monitoring devices configured to obtain PMU data ("synchrophasor" measurements) on the order of twenty to sixty times per second, with the measurements synchronized using a common reference clock.

In general, and as will be understood, measured data and information from legacy components (e.g., PMUs, a topology component, a supervisory control and data acquisition (SCADA) component and/or a state estimator component) are used to identify islands. These data are processed to determine one or more synchronization points (e.g., from the from topology data) and their corresponding equipment (e.g., circuit breakers) whether resynchronization action(s) are available.

An island management application program may be used to interface with an operator or the like to facilitate performance of the resynchronization action(s). For example, the island management application program may display information regarding the islands, the event and equipment that caused the island condition, the stations in each island along with per-station data (e.g., generation, load and frequency), voltage and frequency differences between islands that may be used to determine resynchronization action(s), and a summary of island resynchronization information.

It should be understood that any of the examples herein are non-limiting. For example, the sources of information are only example sources, and other and/or similar such sources may be used. As such, the technology described herein is not limited to any particular implementations, embodiments, aspects, concepts, structures, functionalities or examples described herein. Rather, any of the implementations, embodiments, aspects, concepts, structures, functionalities or examples described herein are non-limiting, and the technology may be used in various ways that provide benefits and advantages in power grid management concepts in general.

The subject disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure may be practiced without these specific details. In other instances, well-known structures and devices are shown in block diagram form in order to facilitate describing the subject disclosure.

As used in this application, the terms "component," "system," "platform," "interface," "node", "source", "agent", and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal).

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

FIG. 1 is an illustration of an example system 100 that facilitates managing energy flow in a power grid system 101 (e.g., an electrical energy distribution system) in accordance with aspects of the technology described herein. The exemplified system 100 includes a power grid management component 102. Additionally, the system 100 may include a state estimator (component) 104 and/or a topology component 106. The power grid management component 102 may be coupled to and/or integrated with the state estimator (component) 104 and/or the topology component 106. The power grid management component 102 may be implemented as (and/or may be associated with) a power grid management system. The power grid management component 102 may include or otherwise be coupled to an island management application (program) 108, e.g., with a graphical user interface or the like.

The power grid management component 102 may identify power grid system events through various power grid system quantities such as voltage, frequency, power grid topology, dynamic phase angle separation and/or rate of change of frequency and/or other data from different parts of the power grid system. In example embodiments, the power grid management component 102 may be integrated with a control center system that manages power transmission and/or power distribution associated with a power grid system (e.g., an electrical energy distribution system). For example, the control center system may measure, analyze and/or control power transmission and/or power distribution associated with the power grid system. The control center system may additionally or alternatively manage other real-time operations associated with the power grid system 101. Furthermore, the power grid management component 102 may operate using a distribution network model, a model of utility customers where customers are connected with respect to the power grid system (e.g., the electrical energy distribution system), and/or a set of observations associated with the power grid system (e.g., the electrical energy distribution system). In an aspect, the system 100 and/or the power grid management component 102 may be associated with a grid stability assessment system. In another aspect, the system 100 and/or the power grid management component 102 may be associated with island management application 108.

The state estimator (component) component 104 may generate and/or provide estimated data as generally represented in FIG. 1. As is known legacy technology, the state estimator is able to provide values such as voltage data, angle data, station generation data and station load data when actual measurements or the like are not available, and/or when measurement PMU data/data received by SCADA systems are erroneous. For example, PMU data may not be present, in which event SCADA data, if present, is evaluated and used, such as for voltages and angles; however SCADA data also may not be present for each component (e.g., a certain bus), whereby the state estimator 104 basically fills in the missing "data gap(s)" with estimated data. The power grid management component 102 (and/or one or more other components) may repeatedly or on-demand provide information to the state estimator and/or receive estimated data from the state estimator 104.

The topology component 106 (sometimes referred to as a topology processor) may generate and/or provide topology data as generally represented in FIG. 1. The power grid management component 102 may repeatedly receive the topology data from topology component 106. The topology data may be indicative of a topology for the power grid system 101. For example, the topology data may be indicative of an arrangement and/or a power status of various devices in the power grid system. The topology component 106 may employ connectivity information and/or switching operation information to generate the topology data (e.g., to construct a network topology of the power grid system 10). Furthermore, the topology component 106 may generate and/or provide the topology data based on a location of devices in the power grid system, a connection status of devices in the power grid system and/or a connectivity state of devices in the power grid system. For example, the topology data may be generated based on connectivity statuses and/or connectivity states of devices in the power grid system 101 (e.g., devices that receive and/or process power distributed in throughout the power grid system). The topology data also may indicate which devices in the power grid system 101 are connected to other devices in the power grid system (e.g., where devices in the power grid system are connected, etc.) and/or which devices in the power grid system are associated with a powered grid connection. For example, the topology component 106 may generate the topology data based on a location of devices with respect to the power grid system (e.g., with respect to other devices in the power grid system). The topology data may be generated based on a status of power sources (e.g., a transformer, an electrical substation, etc.) that provide power in the power grid system 101. The topology data also may include the status of the power sources.

Additionally or alternatively, the topology component 106 may generate and/or provide the topology data based on statuses for switching operations associated with devices in the power grid system. A switching operation may be an operation to interrupt, de-energize and/or disconnect a portion of the power grid system 101 (e.g., one or more devices in the power grid system 101). For example, a switching operation may be an operation to open one or more switches (e.g., circuit breakers) associated with a device in the power grid system (e.g., the switching operation may be an operation to disconnect one or more transmission lines associated with a device in the power grid system). It is understood that a switching operation alternatively may be an operation to energize and/or connect a portion of (e.g., one or more devices in) the power grid system 101. For example, a switching operation may be an operation to close one or more switches associated with a device in the power grid system (e.g., the switching operation may be an operation to connect one or more transmission lines associated with a device in the power grid system). Additionally or alternatively, the topology data may identify where and/or how devices are connected (e.g., to other devices, via particular transmission lines, etc.) within the power grid system. Furthermore, the topology data may provide connectivity states of the devices in the power grid system (e.g., based on connection points, based on busses, etc.).

In one or more example implementations, the topology component 106 may determine connectivity information and/or switching operation information associated with the power grid system 101 based on reports associated with the power grid system 101. The reports may be associated with devices and/or particular locations associated with the power grid system 101. In an aspect, the reports may be generated based on phone calls and/or voice logs received from user identities (e.g., customers) in the power grid system. For example, a customer (e.g., a customer with a device linked to a transformer) may call a control center associated with the power grid management component 102 to report a power outage in the power grid system 101. Furthermore, information provided to the control center by the customer may be employed to generate the reports. In one example, the reports may be generated based on interactive voice response data provided by customers during phone calls to the control center. The reports also may be generated based on weather events and/or other information associated with external systems and/or regional transmission organizations. Additionally, the reports may include a list of alarms related to an interruption in the power grid system. In an aspect, the measured data, estimated data and/or the topology data may be generated based on coded (e.g., encoded) feedback data received from devices in the power grid system.

Figure 2:
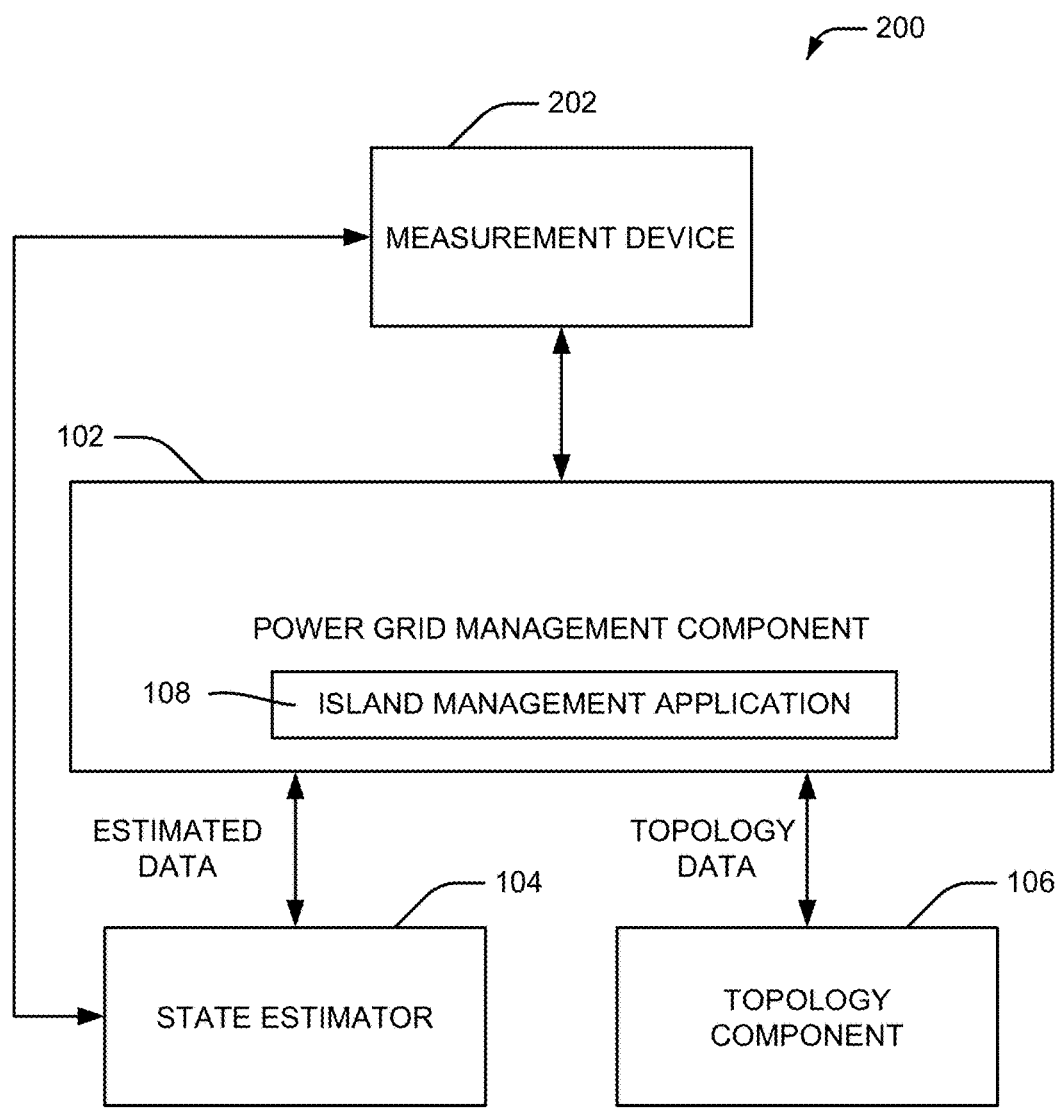
FIG. 2 illustrates another system that facilitates managing energy flow in a power grid system in accordance with aspects of the subject disclosure.

FIG. 2 is a diagram of an example system 200 in accordance with aspects of the subject disclosure. System 200 includes the power grid management component 102. Additionally, the system 200 can include the state estimator 104, the topology component 106 and/or a measurement device 202. It is to be appreciated that the measurement device 202 can be implemented as more than one measurement device and/or associated with more than one measurement device. In general, the measurement device 202 is configured to obtain, monitor, determine and/or analyze electrical characteristics and/or electrical parameters associated with the power grid system 101 (FIG. 1). The measurement device 202 can be a device such as, for example, a phasor measurement device (e.g., a phasor measurement unit). In one example, the measurement device 202 can obtain synchrophasor measurements. Additionally or alternatively, the measurement device 202 can be a monitoring device. However, it is to be appreciated that the measurement device 202 can additionally include, or alternatively be implemented as, another type of device to obtain, monitor and/or determine electrical characteristics associated with the power grid system 101 (FIG. 1). The measurement device 202 can also include and/or be associated with a protection relay, a global positioning system (GPS), a phasor data concentrator, communication capabilities and/or other functionalities.

The measurement device 202 may be coupled to at least a portion of the power grid system associated with the power grid management component 102. For example, the measurement device 202 can be coupled to a transmission line, a flowgate, and/or a device included in the power grid system 101. Furthermore, the measurement device 202 can be associated with a particular sector of the power grid system and/or a particular corridor of the power grid system.

The measurement device 202 may be configured to provide real-time or near real-time measurements for electrical characteristics and/or electrical parameters associated with the power grid system. The measurement device 202 can, for example, repeatedly obtain measurements from the power grid system. In aspect, the measurement device 202 (e.g., a PMU) can repeatedly obtain the measurements from the power grid system during an interval of time that is less than one second. For example, the measurement device 202 can repeatedly obtain sub-second measurements from the power grid system. In an aspect, data generated and/or obtained by the measurement device 202 can be coded data (e.g., encoded data) associated with the power grid system.

Figure 3:
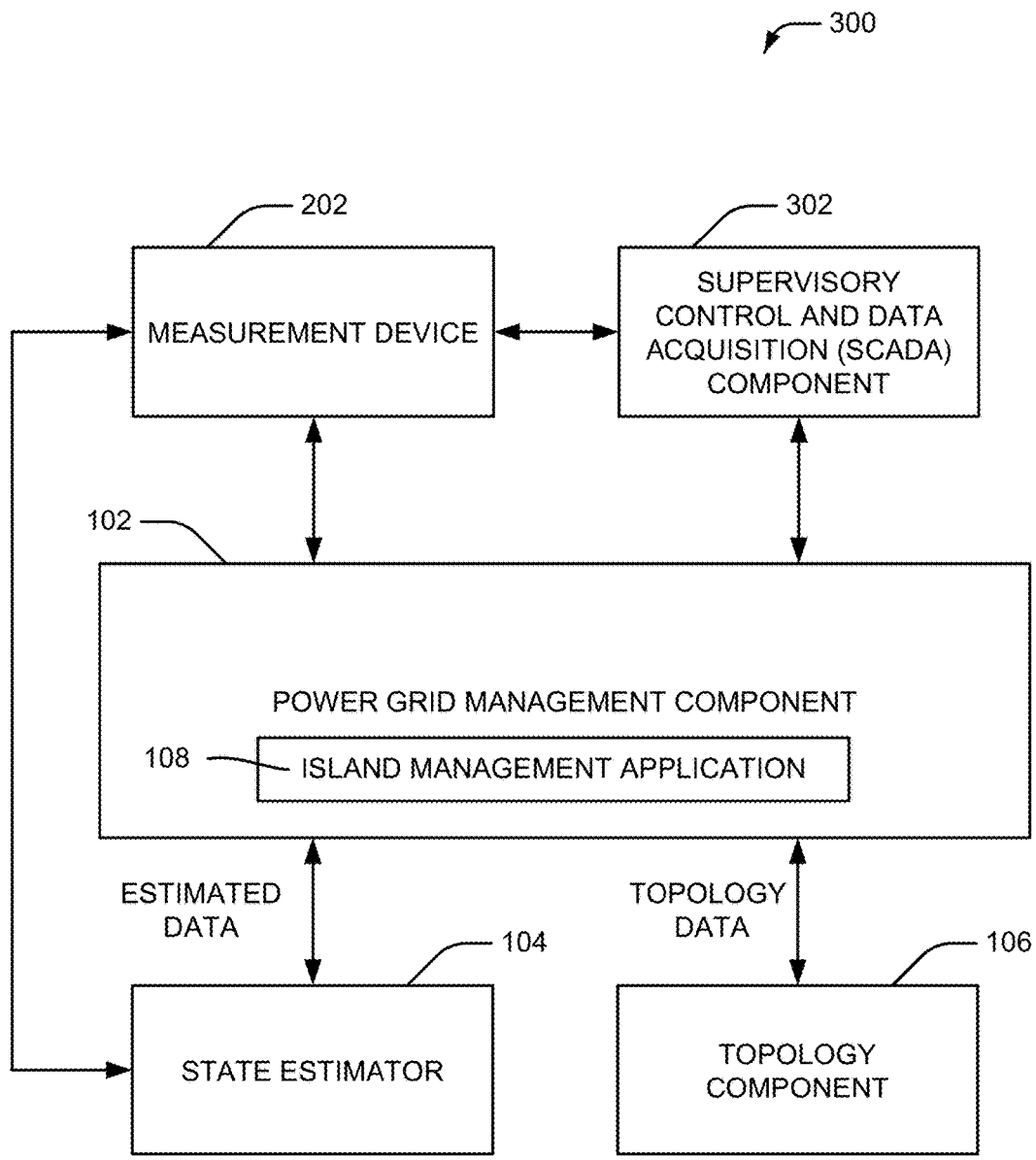
FIG. 3 illustrates yet another system that facilitates managing energy flow in a power grid system in accordance with aspects of the subject disclosure.

FIG. 3 is a diagram of an example system 300 in accordance with aspects of the subject disclosure. System 300 includes the power grid management component 102. Additionally, the system 300 can include the state estimator 104, the topology component 106, the measurement device 202 and/or a SCADA component 302. The SCADA component 302 is generally associated with a system for monitoring and/or controlling devices in the power grid system. For example, the SCADA component 302 may provide real-time information (e.g., real-time information associated with the devices in the power grid system) and/or sensor information (e.g., sensor information associated with the devices in the power grid system) to the power grid management component 102. In an aspect, the SCADA component 302 may control automated processing of alarms in the power grid system, obtain and/or analyze measurement data (e.g., associated with the measurement device 202 and/or another measuring device) in the power grid system, monitor relay data associated with the power grid system, monitor oscillation data associated with the power grid system, manage limits (e.g., set point limits) associated with the power grid system, manage alarms and/or overloads associated with the power grid system, manage tagging data for equipment associated with the power grid system, manage archiving of data associated with the power grid system, manage faults associated with the power grid system (e.g., via a fault location isolation and service restoration (FLISR) system), monitor and/or study the power grid system, and/or manage other data associated with the power grid system. In another aspect, the SCADA component 302 may be associated with remote terminal units connected to sensors in the power grid system, programmable logic controllers connected to sensors in the power grid system and/or a communication system (e.g., a telemetry system) associated with the power grid system. In yet another aspect, the measurement device 202 and/or the SCADA component 302 may be real-time systems for providing real-time data (e.g., real-time data associated with devices, meters, sensors and/or other equipment in the power grid system) to the power grid management component 102. For example, the measurement device 202 and/or the SCADA component 302 may provide real-time measurement data, real-time operational data and/or real-time feedback data to the power grid management component 102.

In yet another aspect, the SCADA component 302 can manage events associated with the power grid system. The SCADA component 302 can also generate device state data associated with determined events and/or tracked events in the power grid system. Device state data generated by the SCADA component 302 can additionally be associated with a tag (e.g., an identifier) for a device in the power grid system. The SCADA component 302 may also obtain and/or analyze measurement data for a device in the power grid system, monitor relay data associated with the power grid system, monitor oscillation data associated with the power grid system, manage limits (e.g., set point limits) associated with the power grid system, manage alarms and/or overloads associated with the power grid system, archiving data associated with a device in the power grid system, manage faults associated with a device in the power grid system, etc. In example embodiments, data determined and/or generated by the SCADA component 302 may be employed by the state estimator 104 and/or the topology component 106 to facilitate generation of the estimated data and/or the topology data. Additionally or alternatively, data determined and/or generated by the SCADA component 302 may be employed by the power grid management component 102 to facilitate management of energy flow in the power grid stem. Data determined and/or generated via the SCADA component 302 may be used by the island management application 108.

Figure 4:
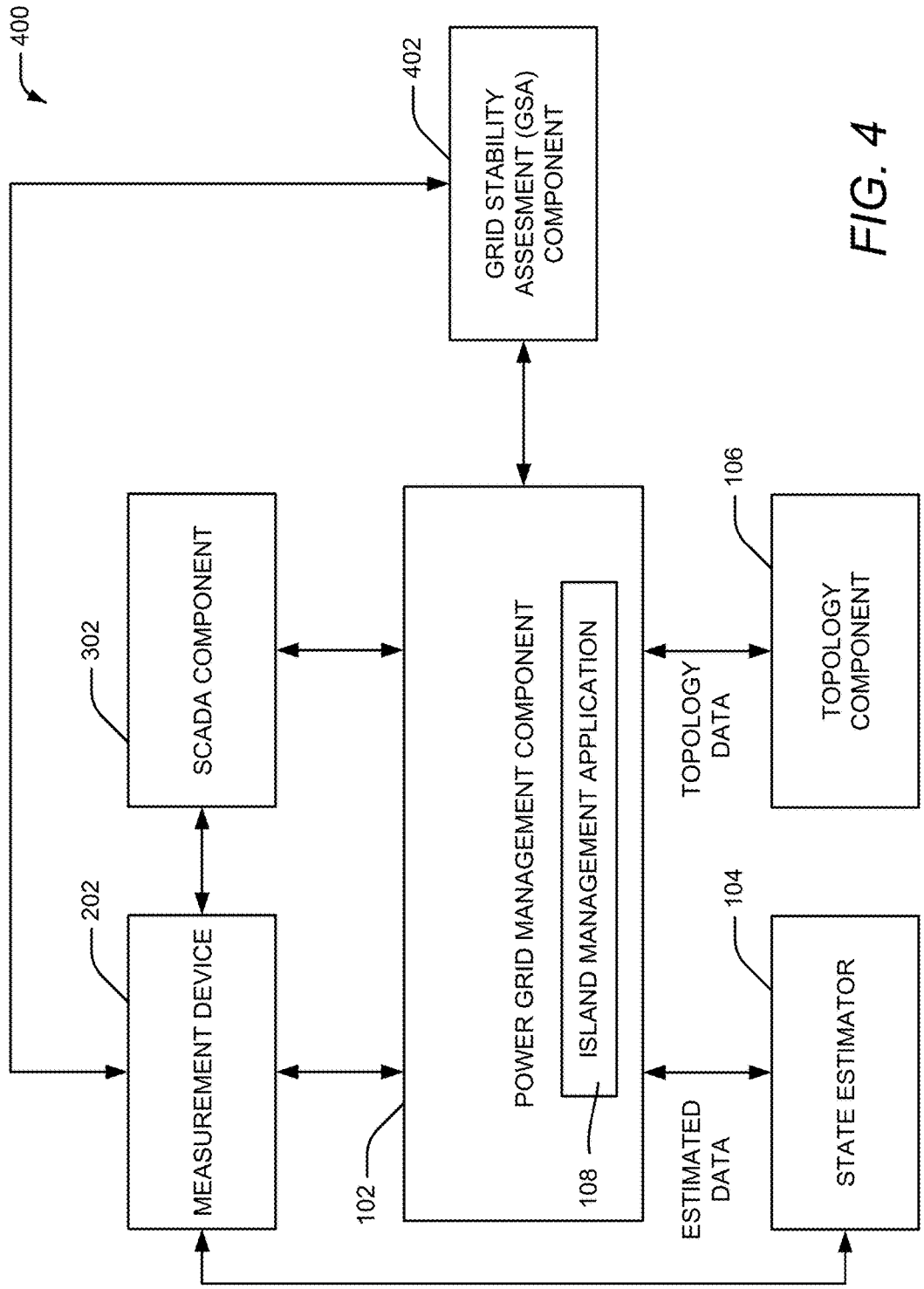
FIG. 4 illustrates yet another system that facilitates managing energy flow in a power grid system in accordance with aspects of the subject disclosure.

FIG. 4 is a diagram of an example system 400 in accordance with aspects of the subject disclosure. System 400 includes the power grid management component 102. Additionally, the system 400 can include the state estimator 104, the topology component 106, the measurement device 202, the SCADA component 302 and/or a Grid Stability Assessment (GSA) component 402. In example embodiments, the GSA component 402 can include the power grid management component 102. The GSA component 402 may be associated with an energy management system for the power grid system, a situational awareness system for the power grid system, a visualization system for the power grid system, a monitoring system for the power grid system and/or a stability assessment system for the for the power grid system. The GSA component 402 may incorporate the island management application 108 (e.g., instead of the power grid management component 102 as depicted in the drawings), the island management application 108 may be a separate component coupled to the system, or may be incorporated into another component.

The GSA component 402 may additionally provide real-time analytics based on measurements associated with the power grid system. For example, the GSA component 402 may process real-time data obtained from the measurement device 202 to determine dynamic behavior of the power grid system. In an aspect, the GSA component 402 may generate, determine and/or store a set of defined patterns for the power grid system. For example, the GSA component 402 may generate, determine and/or store different defined patterns for different locations of the power grid system. The set of defined patterns generated by the GSA component 402 may be, for example, a set of defined voltage patterns for the power grid system. Furthermore, a defined pattern from the set of defined patterns can be associated with a transmission line in the power grid system, a device in the power grid system, a sector of the power grid system and/or a corridor of the power grid system.

Figure 5:
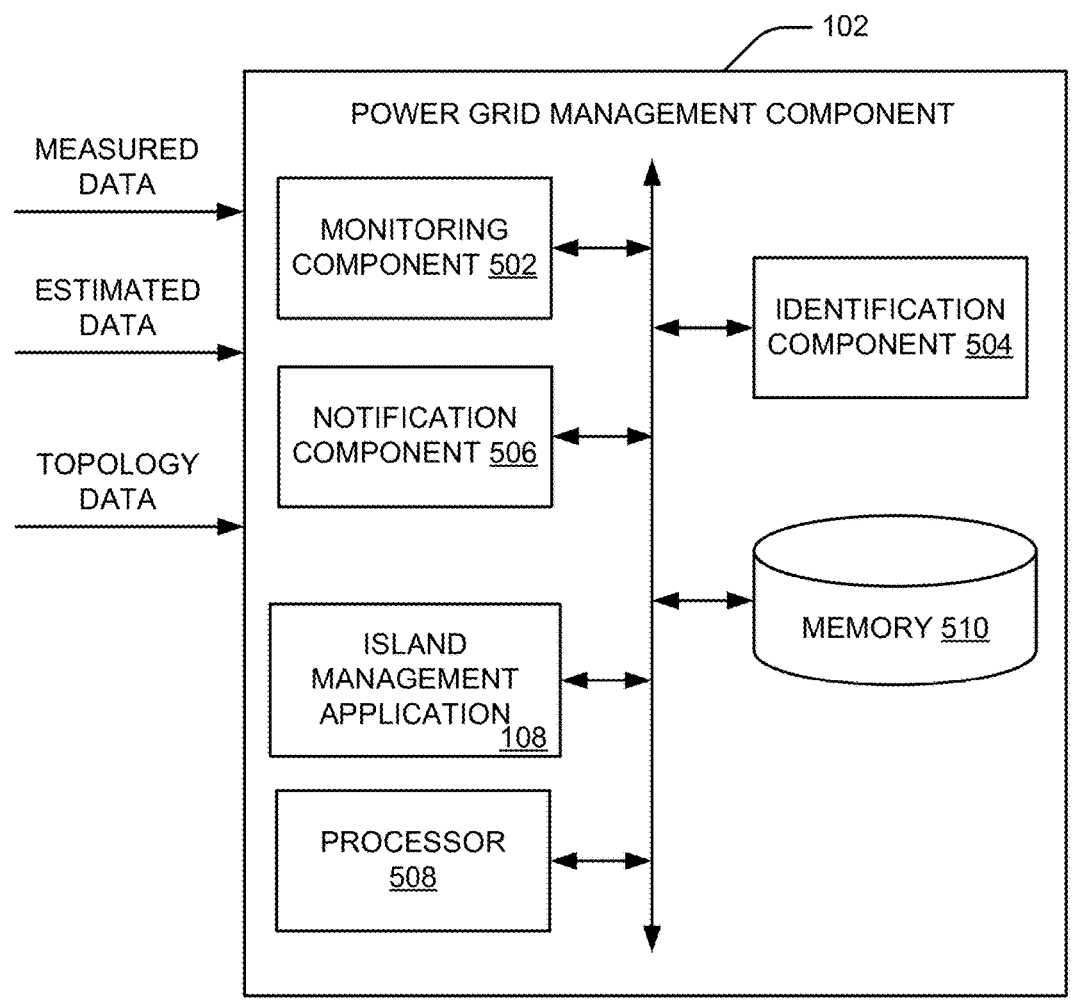
FIG. 5 is a high-level block diagram of an example power grid management component in accordance with aspects of the subject disclosure.

FIG. 5 is a representation of an example power grid management component 102 in accordance with aspects of the subject disclosure. In FIG. 5, the power grid management component 102 includes a monitoring component 502, an identification component 504 and a notification component 506. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. In an aspect, the power grid management component 102 may include memory 510 for storing computer executable components and instructions. The power grid management component 102 can further include a processor 508 to facilitate operation of the instructions (e.g., computer executable components and instructions) by the power grid management component 102.

The monitoring component 502 in general generates monitoring data for the power grid system 101 associated with the power grid management component 102. The monitoring component 502 may generate the monitoring data based on the measured data, estimated data (e.g., provided by the state estimator 104) and/or the topology data (e.g., the topology data provided by the topology component 106).

The identification component 504 may identify a change in the data indicative of an imbalance in the system, including, for example, an island condition. For example, based on the monitoring data, the identification component 504 may identify a change in a voltage, frequency, current, voltage angle and/or the like associated with the main grid and one or more islands. The identification component 504 can also determine, based on the topology data, a location in the power grid system that is associated with the change. In an example embodiment, the identification component 504 can identify a rate of change in the data. The identification component 504 can also determine, based on the topology data, a location in the power grid system that is associated with the rate of change in the data. A location in the power grid system that is determined by the identification component 504 can include, but is not limited to a particular transmission line in the power grid system, a particular device in the power grid system, a particular sector of the power grid system and/or a particular corridor of the power grid system that is associated with the change. A location in the power grid system can also be associated with a geographic location (e.g., a GPS location, etc.).

In an aspect, the identification component 504 may concurrently identify different changes and/or different rate of changes (e.g., different changes in voltage angles and/or different rate of changes in voltage angles) in the power grid system based on the measured data. For example, the identification component 504 may identify a first change and/or a first rate of change associated with a transmission line of the power grid system. At approximately a corresponding instance in time (e.g., for a time-stamp that at least approximately corresponds to a time-stamp associated with the first change and/or the first rate of change), the identification component 504 may additionally identify a second change and/or a second rate of change associated with another transmission line of the power grid system, a device of the power grid system, a sector of the power grid system and/or a corridor of the power grid system.

In yet another aspect, the monitoring component 502 may repeatedly obtain the measured data and/or the topology data during a first period of time. Furthermore, the identification component 504 may identify a such information during a second period of time. In this way, for example, the identification component 504 may identify a change in information based on historical data (e.g., historical power-flow data stored in a data store) that is previously obtained.

The notification component 506 may generate a notification for a graphical user interface in response to a determination that a change in the data and/or a rate of change in the data satisfies a defined criterion. For example, the notification component 506 may generate a notification for a graphical user interface in response to a determination that an islanding event has occurred. In an aspect, the notification component 506 may modify a portion of a graphical user interface in response to the determination. The defined criterion may be, for example, that PMU data indicates different frequencies in parts of the grid, indicative of an island condition. In example embodiments, the notification component 506 may generate information related to a set of actions for modifying a portion of the power grid system in response to the determination. For example, the set of action may be a set of steps to perform with respect to modifying a portion of the power grid system. The set of actions may facilitate a resynchronization of the power grid system.

While FIGS. 1-5 depict separate components in system 100, 200, 300, 400 and 500, it can be readily appreciated that the components may be implemented in a common component. Further, it is understood that the design of system 100, 200, 300, 400 and/or 500 may include other component selections, component placements, etc., to facilitate management of a power grid system (e.g., an electrical energy distribution system).

Figure 6:
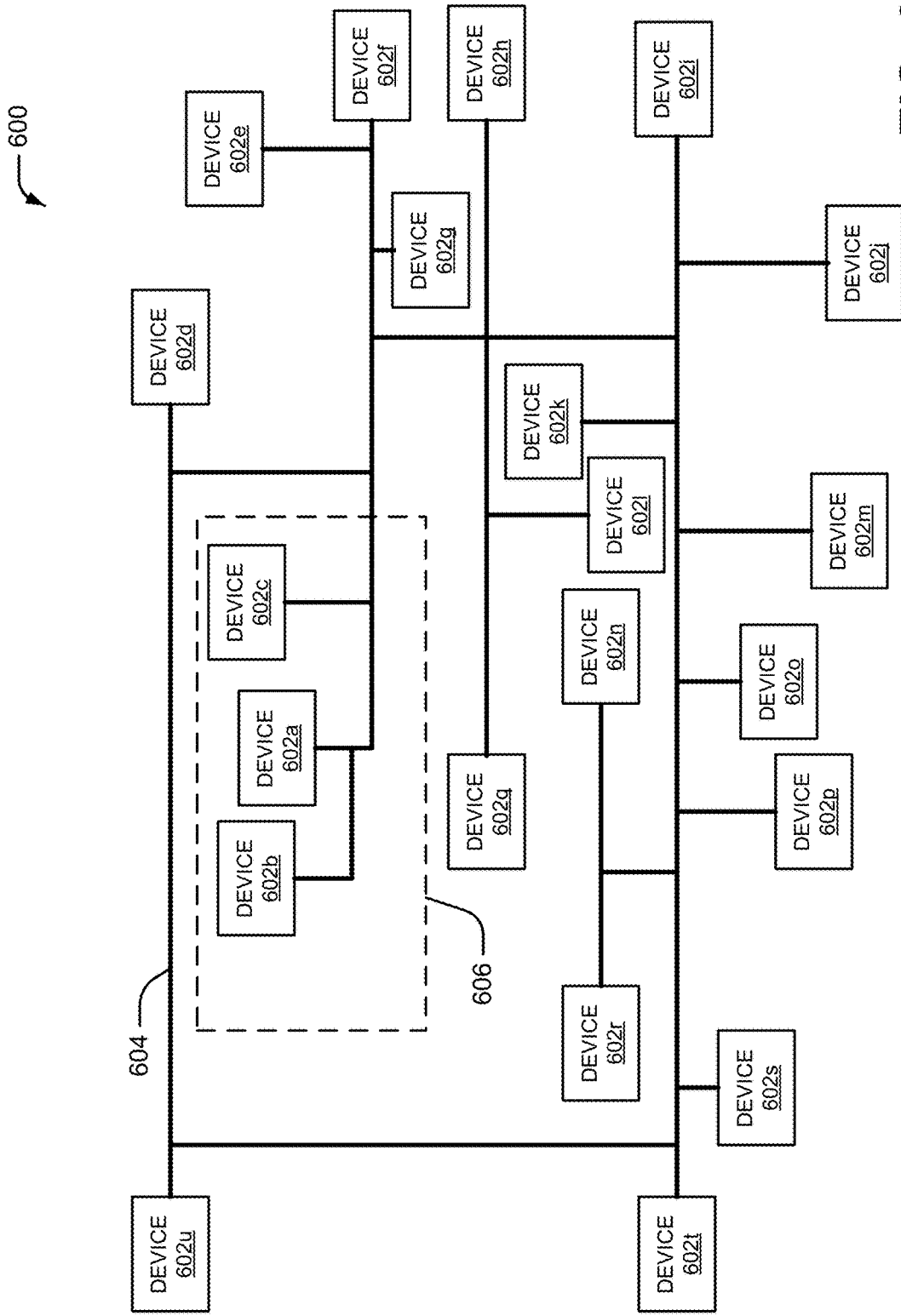
FIG. 6 illustrates an example power grid system in accordance with aspects of the subject disclosure.

FIG. 6 illustrates a power grid system 600 in accordance with aspects of the subject disclosure. For example, the power grid system 600 may be the power grid system 101 of FIG. 1, which may be associated with the power grid management component 102 of FIGS. 1-5. The power grid system 600 as exemplified in FIG. 6 includes devices 602a-u; notwithstanding it is understood that the number of devices shown in the power grid system 600 is merely an example, and that any practical number may be present. Therefore, a power grid system associated with the power grid management component 102 may have a different number of devices than those exemplified. The devices 602a-u may be coupled via a network of transmission lines. For example, device 602u and device 602d may be coupled via a transmission line 604 from a network of transmission lines associated with the devices 602a-u. Furthermore, a subset of the devices 602a-u can be associated with a sector of the power grid system 600. For example, a sector 606 of the power grid system 600 can include device 602a, device 602b and device 602c. In one example, the sector 606 can be a corridor of the power grid system 600.

In a non-limiting example, the measured data and the data provided by the state estimator 104 and/or the topology data provided by the topology component 106 can be associated with a power grid system such as, for example, the power grid system 600. For example, measured and/or computed (PMU/SCADA) data, estimated data provided by the state estimator 104 and/or the topology data provided by the topology component 106 can be associated with at least one device from the devices 602a-u. In another example, the measured, computed and/or estimated data can be associated with the transmission line 604 and/or one or more other transmission lines in the power grid system 600. In yet another example, the measured, computed and/or estimated data can be associated with the sector 606 and/or one or more other sectors in the power grid system 600.

Figure 7A:
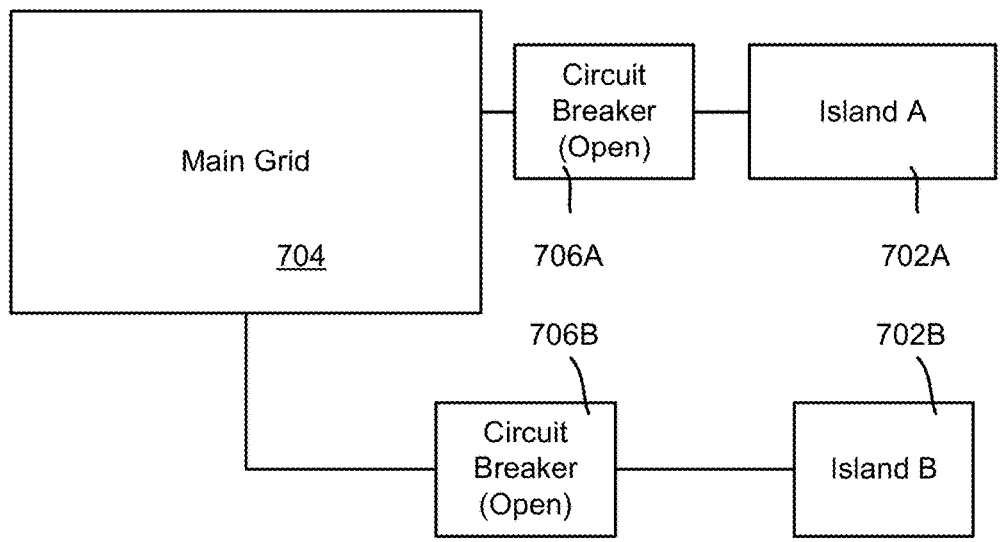
FIGS. 7A, 7B, 8A and 8B represent example islanding conditions and restoration of islands into a power grid in accordance with aspects of the subject disclosure.

Turning to aspects related to Island Management, FIG. 7A shows an island condition in which two islands 702A and 702B are segregated from the main grid 704 due to an islanding event or multiple events, e.g., open circuit breakers 706A and 706B, respectively. Note that it is known how to detect islanding conditions, which can be done in a straightforward way, e.g., the existing PMU data indicates when different frequencies exist, which detects separation of an island from the main grid. In general, when PMU data are unavailable, SCADA data is used; if both PMU data and SCADA data are unavailable for any measured component, estimated data are used.

Figure 7B:
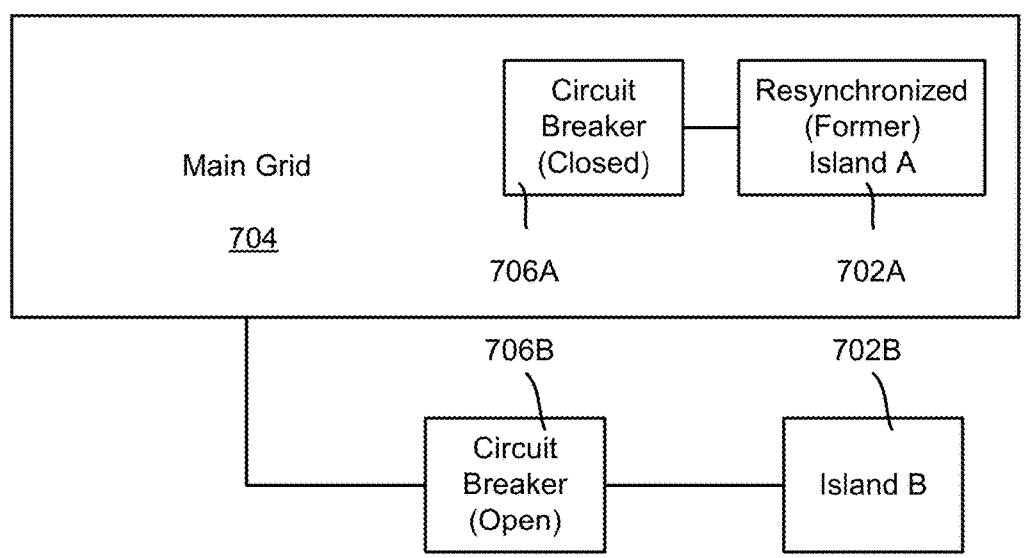

As will be understood, the island management application 108 (FIGS. 1-5) may propose a solution to restore the islands 702A and 702B to the main grid 704. For example, one solution represented in FIG. 7B is to first close the formerly open circuit breaker 706A, which resynchronizes island A 702A. Then, for example, the formerly open circuit breaker 706B may be closed, as shown in FIG. 8B, resulting in a restored grid state. Note that one circuit breaker may need to be closed before the other, e.g., for stabilization purposes.

Figure 8A:
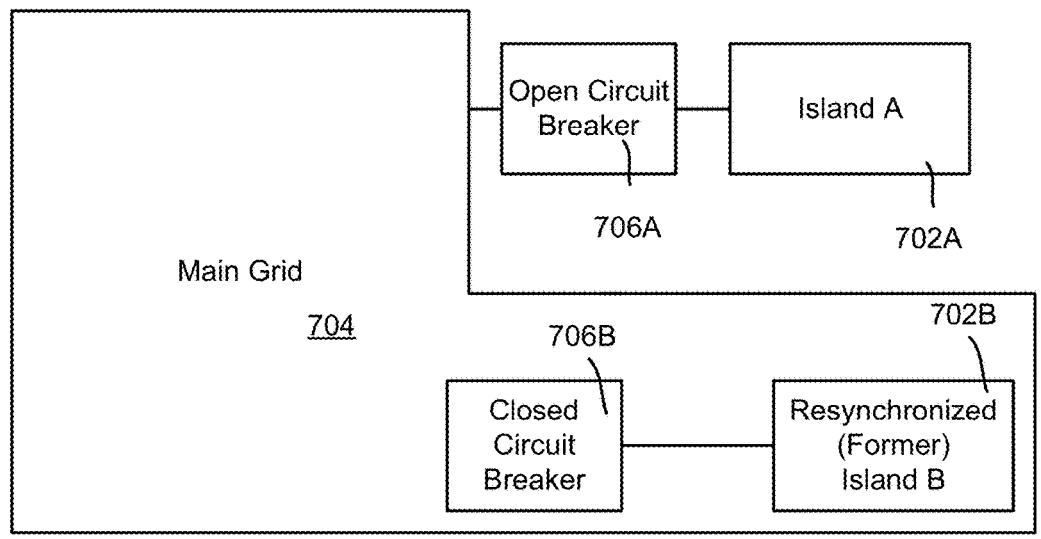
Figure 8B:
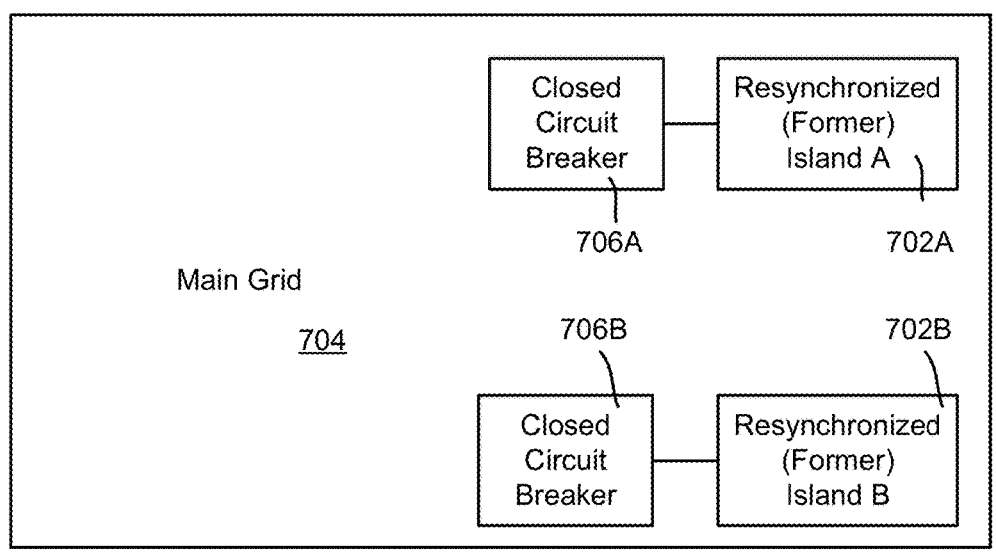

An alternative example solution is represented in FIG. 8A, which instead first closes the formerly open circuit breaker 706B, which resynchronizes island A 702B. Then, for example, the formerly open circuit breaker 706A may be closed, as shown in FIG. 8B, resulting in a restored grid state.

In one or more aspects, as the topology component 106 of FIGS. 1-5, the island management application 108 leverages the outputs of legacy Alstom's Topology Processor (using legacy Alstom's QKNET, or quick network analysis in eterraPlatform), which performs node sort as well as bus sort using a graph search algorithm based on the circuit breaker status obtained from the monitored network to provide the sorted node-bus-island information. The island management application 108 also uses and integrates data obtained from PMUs (using legacy Alstom's eterraPhasorPoint), SCADA (using legacy Alstom's QKNET in eterraPlatform), and the state estimator 104 (using legacy Alstom's RTNET, or Real-Time Network Analysis, in eterraPlatform) for internal computation. The state estimator 104 is a steady state power system analysis function that calculates the complex voltages at network buses using power flow equations and redundant real-time measurements; the voltages may be used to calculate real and reactive power flows even though measurements may not be available at all locations.

The island management application 108 recognizes the change in topology during an islanding event due to Branch topology changes, e.g., line and transformer trips due to opening of a circuit breaker at one end as well as both ends of the component, and/or bus topology changes, e.g., bus splits due to opening of a circuit breaker connecting two buses. The island management application 108 also recognizes the multiple PMU frequency measurement clusters formed due to the islanding event (based on frequency, rate of change of frequency or ROCOF, etc.) and aligns frequency-based information with topology-based information with respect to the island formation event to make the assessment highly dependable.

Based on topology data, the island management application 108 performs sorting of Stations (along with Company and Division) by island(s) to determine the composition of each island. The island management application 108 also obtains the voltage, real power, and frequency data from SCADA/State Estimator/Linear State Estimator and PMUs, respectively to provide detailed information at the Station Level for each of the islands. The island management application 108 internally keeps track of the open circuit breakers related to open branches (lines and transformers) as well as circuit breakers related to buses in each island. The island management application 108 uses this internally stored open status information of circuit breakers and branch components along with the node-bus-island information, and voltage and frequency difference data to identify island resynchronization paths.

When a topology change (e.g., due to a branch and/or bus topology change) causes resynchronization of the previously formed islands, the island management application 108 recognizes the resynchronized state, changes the open status of the internally stored historical information of circuit breakers and branch components, and stores this (circuit breaker and branch component) status transition information. The island management application 108 also recognizes the reduction in the number of PMU frequency measurement clusters that occurs due to the island resynchronization event and aligns frequency-based information with topology-based information with respect to the island resynchronization event, which in turn makes the assessment very robust.

The island management application 108 can provide various information to the control center operators whenever any islanding event takes place, including real time island monitoring information. Real time island monitoring includes information about the cause and location of the islanding event, island size (e.g., number of buses and branches in the island), island composition (e.g., including stations in the island, station load, station generation, and station frequency), PMUs in each island, and the overall island frequency.

Figure 9:
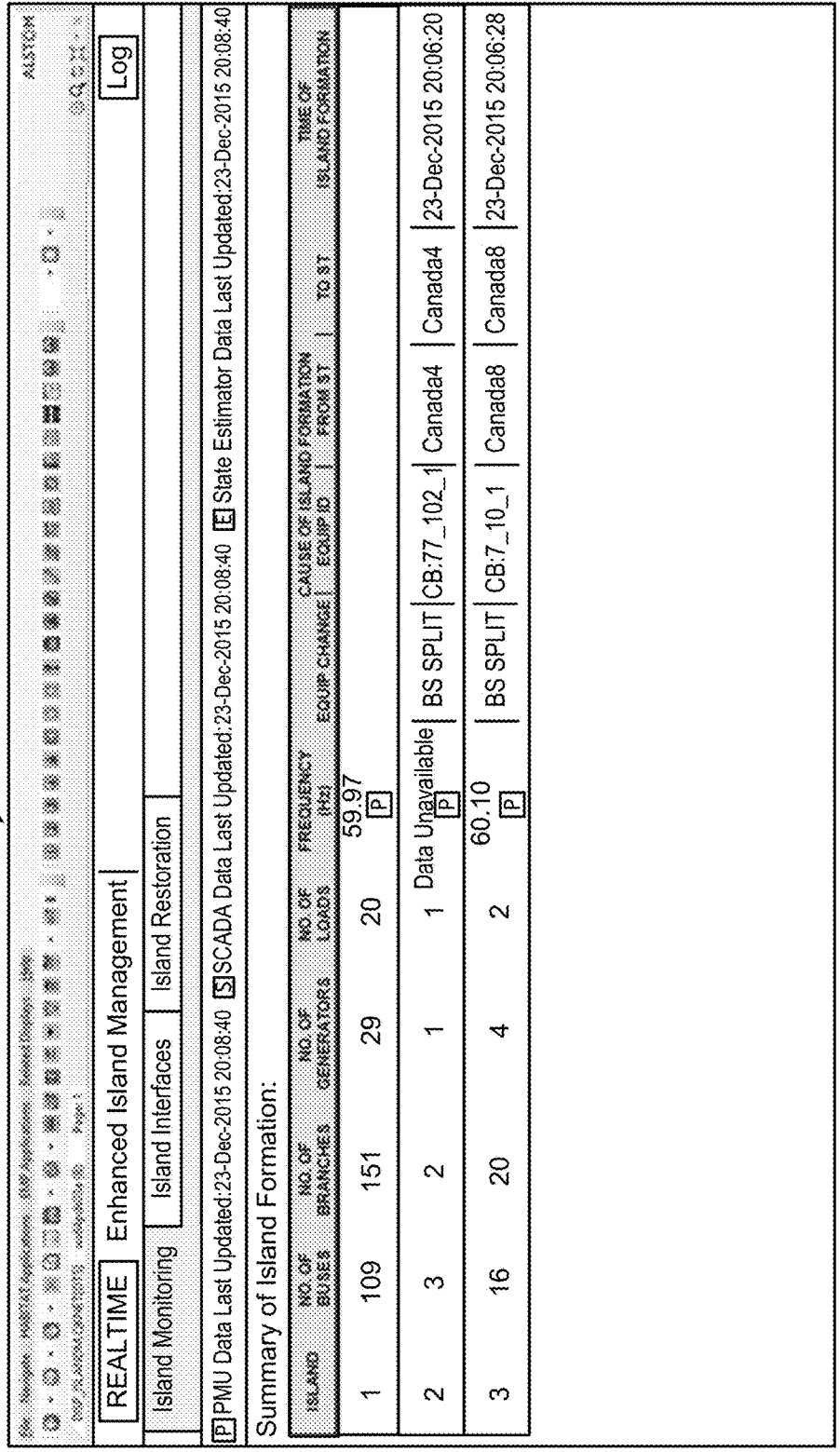

FIG. 9 shows a screenshot 902 representing the cause and location of islanding events along with the island size and frequency for each, where available. For example, a graphical user interface that shows the screenshot 902 can be generated by and/or associated with the power grid management component 102. Furthermore, the graphical user interface can be associated with a display of a device (e.g., a computing device), which can include, for example, a computer, a laptop computer, a mobile device, a handheld device, a cellular phone (e.g., a smartphone), a tablet device, an interactive monitor, another type of device capable of displaying and/or presenting a graphical user interface, etc.

Note that the main grid is also an island, as it is segregated from the other island or islands. Typically the main grid is considered as the island with the most resources after a split, e.g., buses, branches, generators and loads. However, with respect to resynchronization of an island with the "main grid," what is considered the main grid is arbitrary. For example, an operator can choose which of the islands to be considered the main grid; thus, for example, the operator could choose island 2 in FIG. 9 as the main grid, resynchronize islands 2 and 3, and then resynchronize island 1 with those two (now combined) islands.

FIG. 10 shows a screenshot 1002 representing the composition of an island at the individual station level, along with the generation resources and load (in terms of power generation and consumption) in each station in the island, and the station level frequency. For example, an island in FIG. 9 may be clicked on to reach the screenshot of FIG. 10. Note that in this example, the MW generation and load percentage data are obtained from the state estimator, as indicated by the boxed "E" for each station, that is, the state estimator provides the per-station composition information. The frequency, where available, is obtained via PMU data, as indicated by the boxed "P" for each station.

It is also feasible to have one part of a station in one island and another part in another island. This state, if detected, would be indicated as a "YES" status in the "ST IN MULT ISALNDS" (station in multiple islands) condition column, however in FIG. 10 no such station exists in this state.

Figure 11:
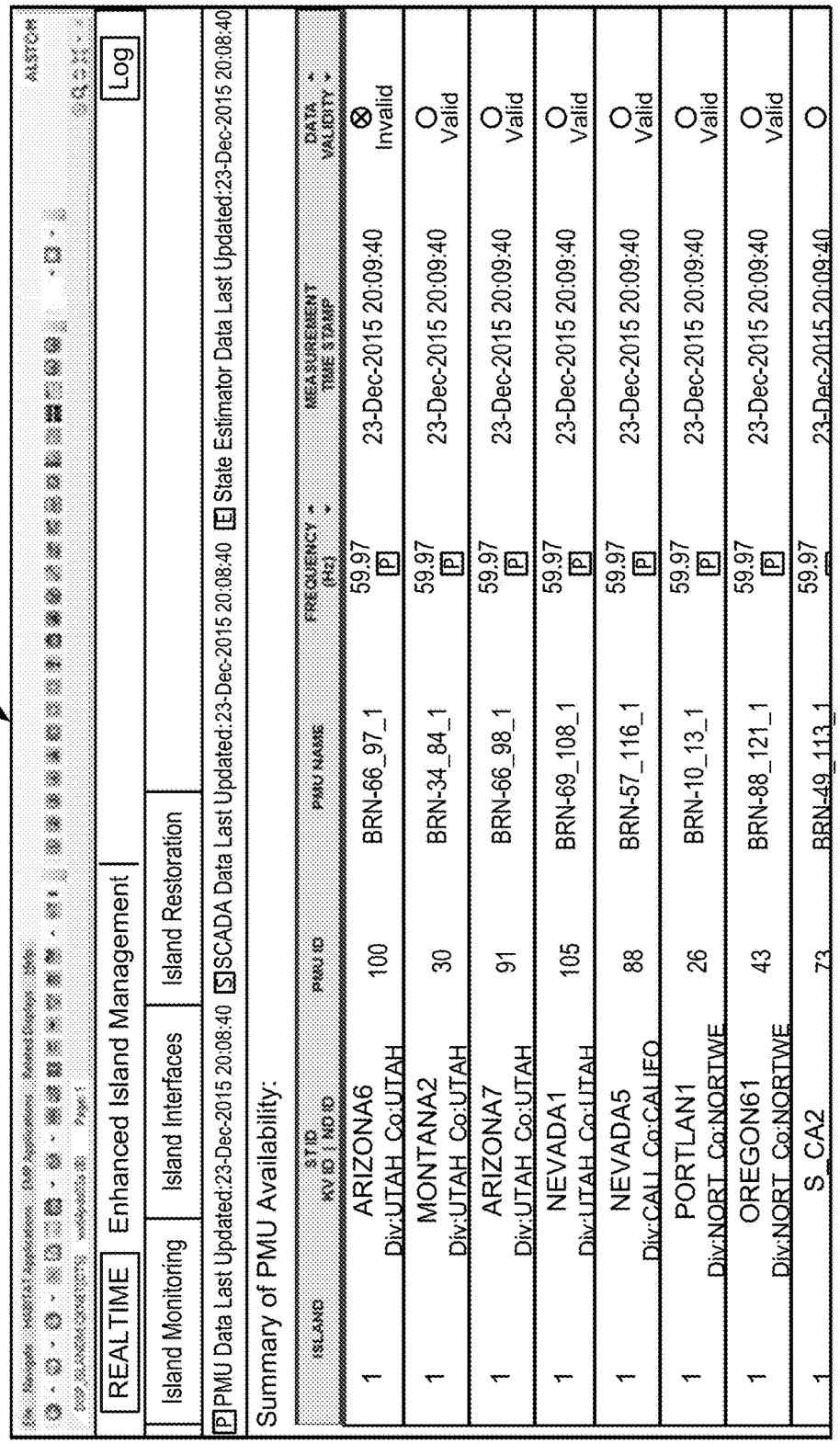

FIG. 11 shows a screenshot 1102 representing the station composition of each island (Island 1 is currently displayed), along with the available PMU measurements at individual station level in each island. Note that PMU data may or may not be valid, e.g., the station with ID "ARIZONA6" in FIG. 11 has been evaluated by the system to have invalid PMU data. This may be, for example, a frequency measurement that is inconsistent with others in the island, although in this particular example another inconsistency or the like has caused the invalid PMU data state (PMU data may associated with a data quality measurement, which may be used to establish invalidity). Note that even one valid PMU in an island provides sufficient frequency data for the island.

With respect to suggested island resynchronization actions, such actions generally comprise information about the circuit breaker in a station or a group of circuit breakers in one or more stations that can be closed by the operators to resynchronize the formed island with the main island/system. Note that the topology data (or voltage/frequency data) may not allow any resynchronization action(s). In addition to proposing one or more points for merging the formed islands, the island management application 108 also assists the operators during the entire resynchronization process by providing useful real time information about the voltage difference and frequency difference across each proposed circuit breaker in the suggested restoration path/points. Note that in one or more implementations, two adjacent islands (e.g., separated by a single circuit breaker) typically have a single resynchronization point, e.g., the open circuit breaker, if there is any resynchronization point. Note that this open circuit breaker can only be closed to merge the islands if the difference in voltage between the islands is below a threshold voltage difference value, and the difference in frequency between the islands is below a threshold frequency difference value. In alternative implementations, a resynchronization "path" comprises one or more resynchronization points (assuming at least one resynchronization point exists), which may be determined and used rather than being limited to a single resynchronization point.

FIG. 12 shows a screenshot 1202 representing boundaries between the islands in terms of the equipment (e.g., line) and circuit breaker in a station that may be closed as a part of the restoration action to merge and resynchronize the islands. FIG. 12 also shows the voltage difference and frequency difference across the suggested breakers to identify if conditions are viable for resynchronization of the islands. Note that the depicted voltage differences are associated with a boxed "S" character, meaning that the SCADA measurement data provided the information.

In FIG. 12, the operator may, for example, determine from the frequency and voltage differences that island 1 and 3 have low enough differences, and may be connected by closing circuit breaker "CB:6_28_1" in the "CB" column. This will merge islands 1 and 3, whereby the island condition will no longer exist (whereby rows 1 and 2 may disappear from this display in one or more implementations). This resynchronization action will change the state of (now island 1), whereby the operator can determine whether island 2 can be resynchronized. Note that if both breakers need to be closed, only one of the two rows corresponding to the closed breaker disappears, so that the operator knows to continue and close the second breaker to fully resynchronize the island.

As can be seen, the island management application not only shows the islanding condition in FIG. 9, but further provides information exemplified in the screenshots of FIGS. 10-12 to augment the island information, such as what caused the condition and what can be done to merge/restore the island back to the main grid.

With respect to real time tracking of island resynchronization actions, tracking data includes the real time tracking of the actual resynchronization actions chosen by the operators (out of the suggested restoration actions) and information about the cause and location of the island resynchronization event, island MW generation and MW load, island composition (that may, for example, include stations in the island, station load, station generation, and station frequency), PMUs in each island, and the overall island frequency.

Figure 13:
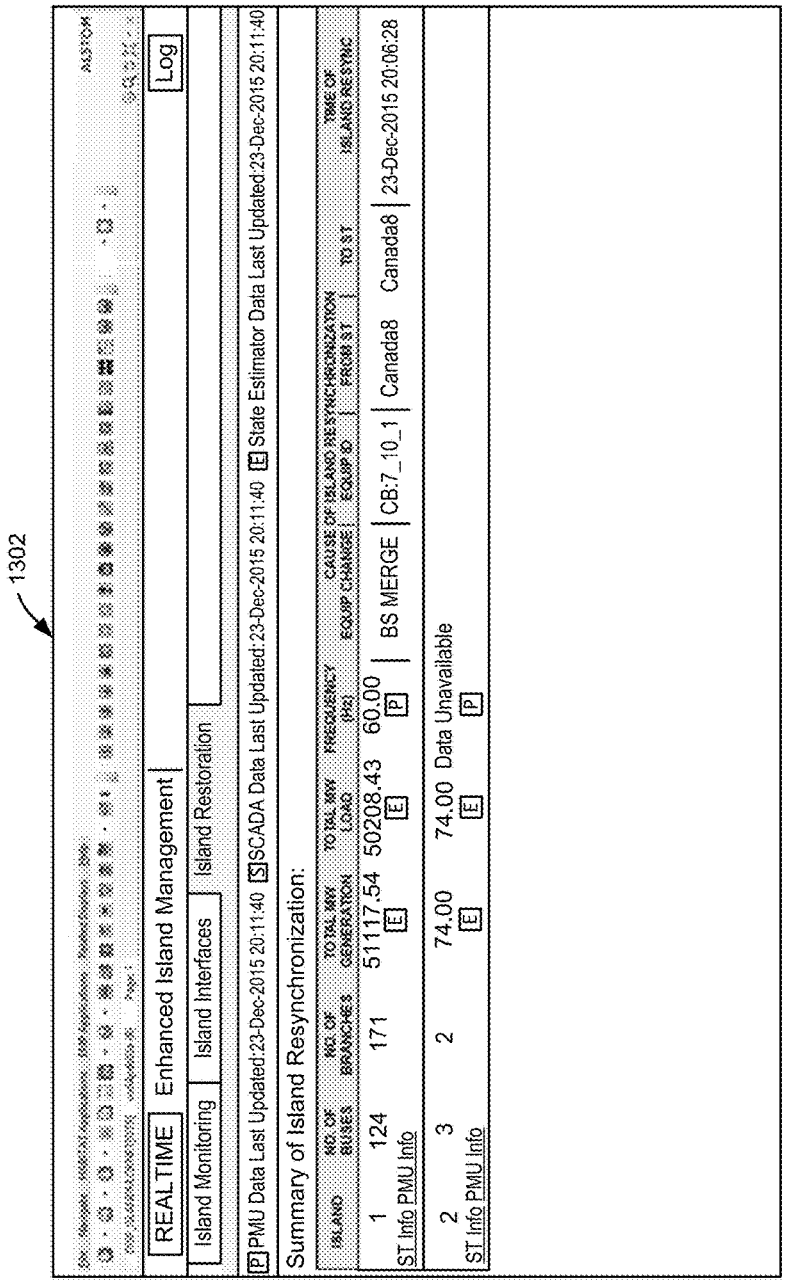

FIG. 13 shows a screenshot 1302 representing the cause (BS_MERGE, CB:7_10_1) and location of the islanding resynchronization event along with the island size, total MW generation and load in the island and the island frequency.

Figure 14:
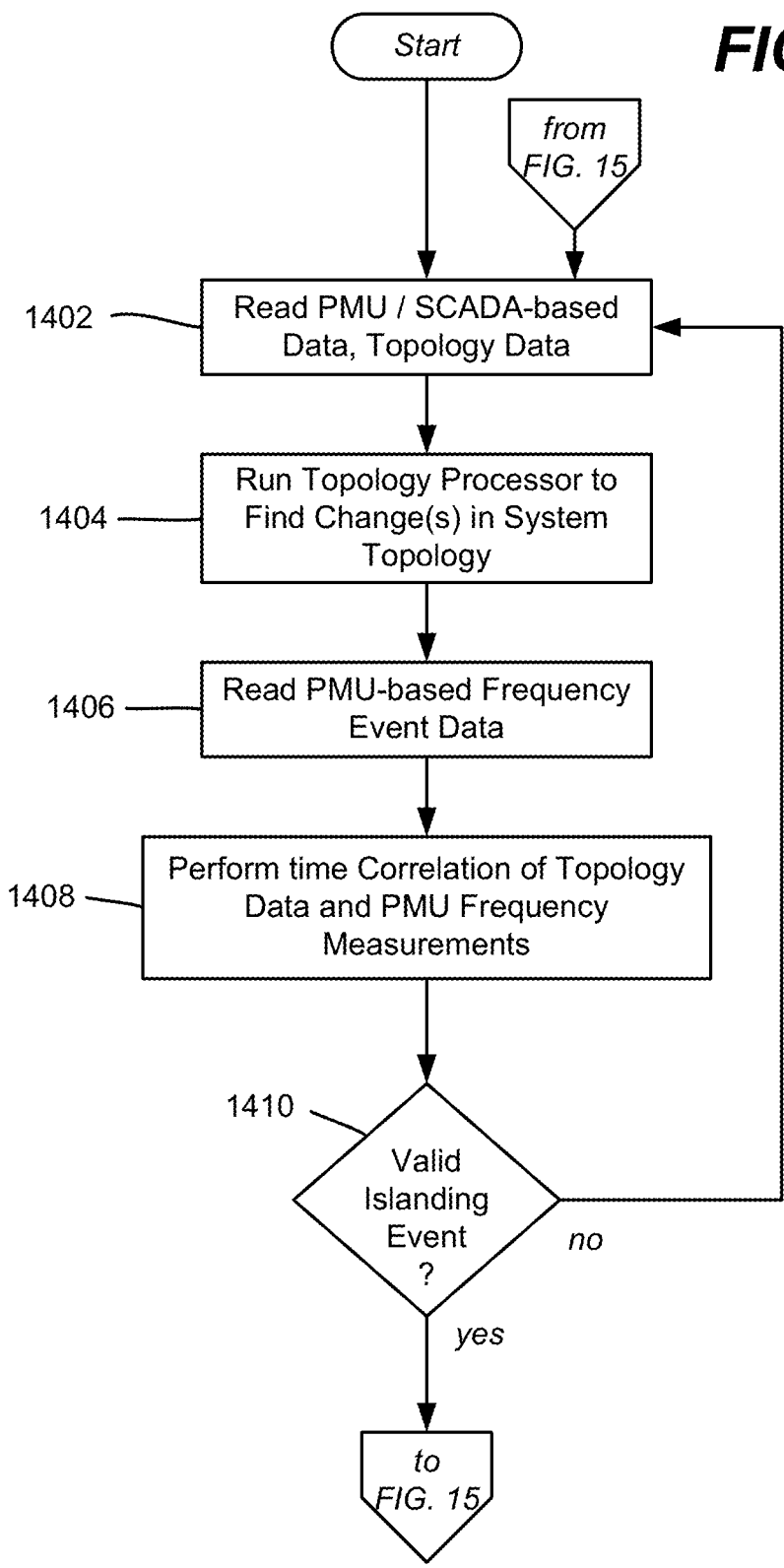
FIGS. 14 and 15 represent example operations that may be used to detect and merge one or more islands back into a main power grid of a power grid system in accordance with aspects of the subject disclosure.
Figure 15:
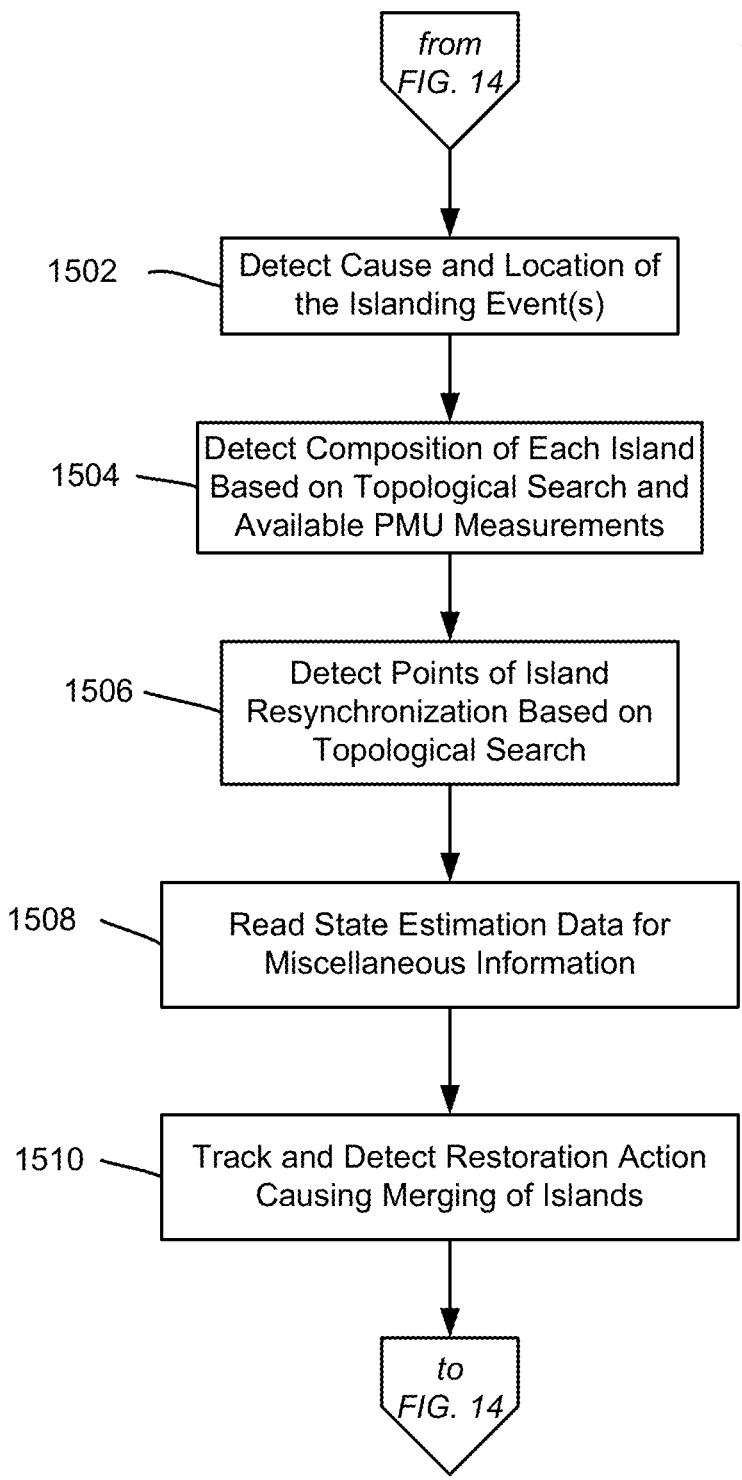

In view of the example system(s) described above, example operations that can be implemented in accordance with the disclosed subject matter can be better appreciated with reference to the flow diagram of FIGS. 14 and 15. For purposes of simplicity of explanation, example operations disclosed herein are presented and described as a series of acts; however, it is to be understood and appreciated that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methods. Furthermore, not all illustrated acts may be required to implement a described example method in accordance with the subject specification. Further yet, two or more of the disclosed example methods can be implemented in combination with each other, to accomplish one or more aspects herein described. It should be further appreciated that the example methods disclosed throughout the subject specification are capable of being stored on an article of manufacture (e.g., a computer-readable medium) to allow transporting and transferring such methods to computers for execution, and thus implementation, by a processor or for storage in a memory.

FIGS. 14 and 15 illustrate a methodology for managing grid restoration in response to an islanding event in the form of operations exemplified as steps. At step 1402 of FIG. 14, the island management application 108 reads the PMU data and SCADA-based data including SCADA-based topology data. At step 1404, the application 108 runs the topology processor to find any changes in the system topology. Step 1406 reads the PMU-based frequency event data.

With this information, the application 108 at step 1408 performs a time correlation of the topology data and the PMU frequency measurements. This establishes (step 1410) whether a valid islanding event has occurred or not; for example, frequency differences between what should be connected devices (e.g., FIG. 6) can indicate an actual island. If not, step 1410 returns to step 1402 for another evaluation, and so on, although some delay may occur between the evaluations.

When a valid islanding event is detected, step 1410 continues to step 1502 of FIG. 15, which represents detecting the cause and location of the islanding event or events. Step 1504 detects the composition of each island based on a topological search and the available PMU measurements.

With this information, step 1506 detects points of island resynchronization based on the topological search e.g., the circuit breaker or various circuit breakers that can be closed to resynchronize an island with the main grid. These points then become suggestions to the operators for merging the islands back with the main grid.

Step 1508 reads the state estimation data to fill in unavailable data, (as well as possibly correct any incorrect SCADA/PMU data). With this information, the operator may now analyze what has occurred (e.g., via the displays exemplified in FIGS. 9-12) so as to take appropriate resynchronization actions to merge island(s). Note that the island management application program may assist in the determination of actions, e.g., prevent closing a circuit breaker if the voltage or frequency differences exceed thresholds, rank/set a preference on the order of closing multiple breakers, e.g., close the breaker corresponding to the smallest differences first among island pairs, suggest increasing the voltage and/or frequency to reduce large differences, and so on.

Step 1510 tracks and detects the results of the restoration action(s) that cause the merging of the island or islands. This is exemplified in FIG. 13.

One or more aspects comprise detecting a change in power grid topology that results from an islanding event in a power grid that segregates the power grid into a main grid and one or more islands. In response to the detecting the change in the power grid topology, aspects include determining the composition of each island of the one or more islands, obtaining voltage data, real power data, and frequency data for each island of the one or more islands, and identifying at least one island resynchronization point based on the composition of each island, the voltage data, the real power data, and the frequency data. Described herein is outputting information corresponding to each island resynchronization point.

Determining the composition of each island may comprise performing a topological search of each island of the one or more islands. Determining the composition of each island may comprise processing phasor measurement unit data associated with the power grid.

Detecting the change in the power grid topology may comprise recognizing a bus topology change of one or more buses of the power grid. Recognizing the bus topology change may comprise detecting a branch topology change of one or more branches of the power grid as result of opening at least one circuit-breaker coupled to a line component of the power grid or a transformer component of the power grid, and further comprising tracking respective statuses of the at least one circuit-breaker. Recognizing the bus topology change may comprise detecting an opening of a circuit breaker connecting two of the buses and further comprising tracking a status representing the opening of the circuit breaker.

Identifying the at least one island resynchronization point may comprise processing circuit-breaker open status information, voltage difference data between islands and frequency difference data between islands to identify the at least one island resynchronization point.

Outputting the information corresponding to each island resynchronization path may comprise outputting at least one suggested resynchronization action via an application program. The outputting of the at least one suggested resynchronization action may comprise generating a recommendation to close at least one circuit breaker.

Outputting the information corresponding to each island resynchronization path may comprise outputting at least one suggested merging action for resynchronization of each segregated island. Outputting of the at least one suggested merging action may comprise generating a recommendation to close at least one circuit breaker.

Aspects may include outputting islanding event cause information and islanding event location information via an application program. Other aspects may include outputting island size data and island frequency data for at least one island of the group of islands via an application program.

One or more aspects are directed towards island management logic, comprising topology processor logic configured to detect a change in topology of a power grid system, and phasor measurement unit processing logic configured to read frequency event data based on phasor measurement unit data to determine whether a valid islanding event has occurred that has segregated the power grid into a main grid and one or more islands. In response to the valid islanding event being determined to have occurred, the island management logic is further configured to recognize the change in topology, determine the composition of each island of the one or more islands, identify at least one island resynchronization point, and output information corresponding to the at least one island resynchronization point.

The island management logic may be further configured to obtain voltage data, real power data, and frequency data for each island of the one or more islands and process the voltage data, real power data, and frequency to identify the at least one island resynchronization point. The island management logic may be further configured to recognize the change in topology as corresponding to an opening of at least one circuit-breaker. The island management logic may be further configured to output at least one suggested resynchronization action relating to the at least one island resynchronization point via an application.

One or more aspects are directed towards, in response to a detection of a change in power grid topology that results from an islanding event in a power grid that segregates the power grid into a main grid and one or more islands, obtaining voltage data, real power data, and frequency data for each island of the one or more islands. Aspects include identifying a resynchronization point based on the voltage data, the real power data, and the frequency data, and outputting a suggested resynchronization action corresponding to the resynchronization point to an output of an application program Identifying the resynchronization point may be further based on a respective composition of each of the one or more islands, and wherein the operations further comprise, processing phasor measurement unit data to determine the respective compositions. Further operations may comprise outputting, to an application program for inclusion in a rendering by the application program, islanding event cause information, islanding event location information, island size data and island frequency data for at least one of the one or more islands.

Figure 16:
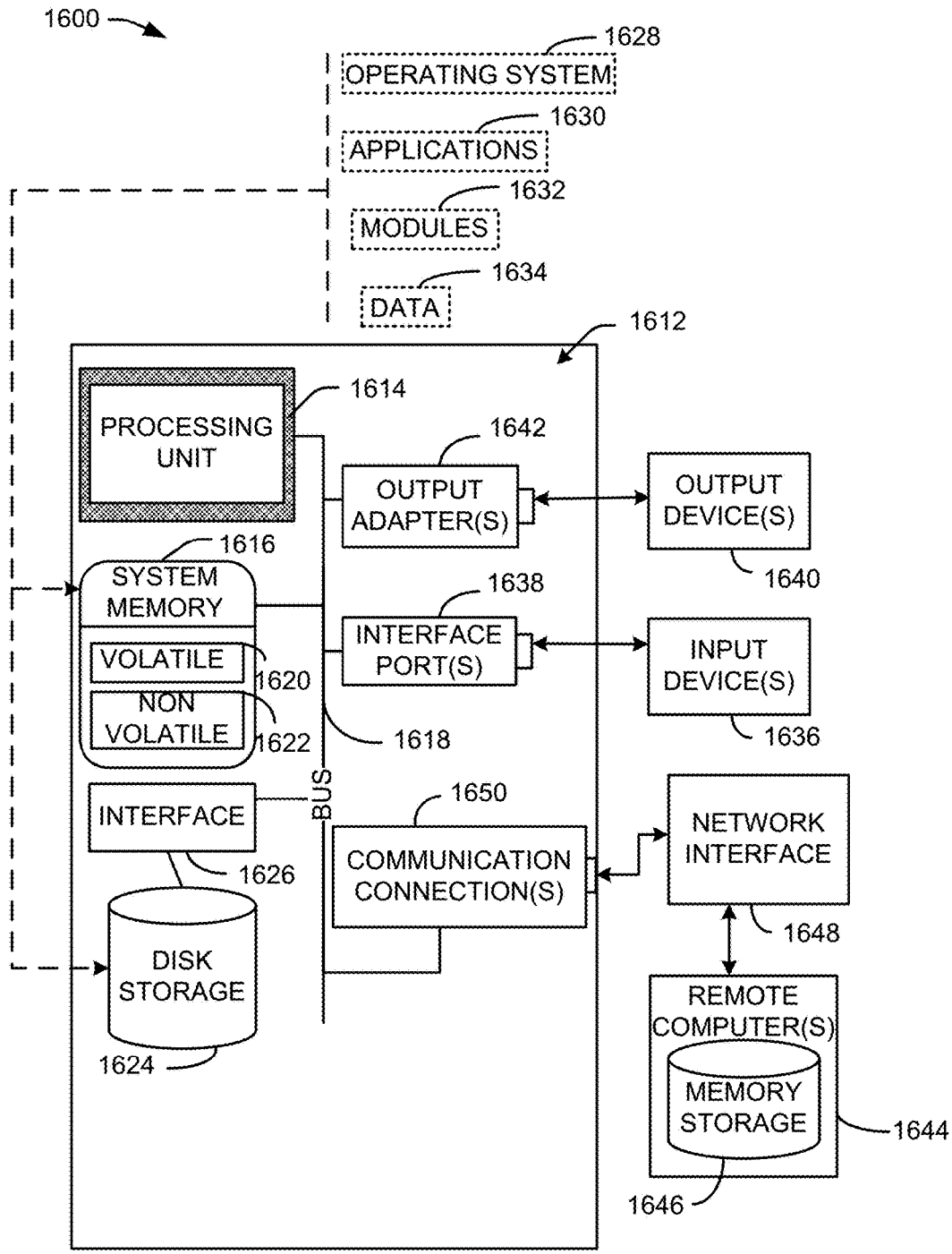
FIG. 16 is a schematic block diagram illustrating a suitable operating environment.

In order to provide a context for the various aspects of the disclosed subject matter, FIG. 16, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules include routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can include both volatile and nonvolatile memory, by way of illustration, and not limitation, volatile memory 1620 (see below), non-volatile memory 1622 (see below), disk storage 1624 (see below), and memory storage 1646 (see below). Further, nonvolatile memory can be included in read only memory, programmable read only memory, electrically programmable read only memory, electrically erasable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, including single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

FIG. 16 illustrates a block diagram of a computing system 1600 operable to execute the disclosed systems and methods in accordance with an embodiment. Computer 1612 includes a processing unit 1614, a system memory 1616, and a system bus 1618. System bus 1618 couples system components including, but not limited to, system memory 1616 to processing unit 1614. Processing unit 1614 can be any of various available processors. Dual microprocessors and other multiprocessor architectures also can be employed as processing unit 1614.

System bus 1618 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1794), and small computer systems interface.

System memory 1616 can include volatile memory 1620 and nonvolatile memory 1622. A basic input/output system, containing routines to transfer information between elements within computer 1612, such as during start-up, can be stored in nonvolatile memory 1622. By way of illustration, and not limitation, nonvolatile memory 1622 can include read only memory, programmable read only memory, electrically programmable read only memory, electrically erasable read only memory, or flash memory. Volatile memory 1620 includes read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, Synchlink dynamic read only memory, Rambus direct read only memory, direct Rambus dynamic read only memory, and Rambus dynamic read only memory.

Computer 1612 can also include removable/non-removable, volatile/non-volatile computer storage media. FIG. 16 illustrates, for example, disk storage 1624. Disk storage 1624 includes, but is not limited to, devices like a magnetic disk drive, floppy disk drive, tape drive, flash memory card, or memory stick. In addition, disk storage 1624 can include storage media separately or in combination with other storage media including, but not limited to, an optical disk drive such as a compact disk read only memory device, compact disk recordable drive, compact disk rewritable drive or a digital versatile disk read only memory. To facilitate connection of the disk storage devices 1624 to system bus 1618, a removable or non-removable interface is typically used, such as interface 1626.

Computing devices typically include a variety of media, which can include computer-readable storage media or communications media, which two terms are used herein differently from one another as follows.

Computer-readable storage media can be any available storage media that can be accessed by the computer and includes both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can include non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

It can be noted that FIG. 16 describes software that acts as an intermediary between users and computer resources described in suitable operating environment 1600. Such software includes an operating system 1628. Operating system 1628, which can be stored on disk storage 1624, acts to control and allocate resources of computer system 1612. System applications 1630 take advantage of the management of resources by operating system 1628 through program modules 1632 and program data 1634 stored either in system memory 1616 or on disk storage 1624. It is to be noted that the disclosed subject matter can be implemented with various operating systems or combinations of operating systems.

A user can enter commands or information into computer 1612 through input device(s) 1636. As an example, a user interface can be embodied in a touch sensitive display panel allowing a user to interact with computer 1612. Input devices 1636 include, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1614 through system bus 1618 by way of interface port(s) 1638. Interface port(s) 1638 include, for example, a serial port, a parallel port, a game port, a universal serial bus, an infrared port, a Bluetooth port, an IP port, or a logical port associated with a wireless service, etc. Output device(s) 1640 use some of the same type of ports as input device(s) 1636.

Thus, for example, a universal serial busport can be used to provide input to computer 1612 and to output information from computer 1612 to an output device 1640. Output adapter 1642 is provided to illustrate that there are some output devices 1640 like monitors, speakers, and printers, among other output devices 1640, which use special adapters. Output adapters 1642 include, by way of illustration and not limitation, video and sound cards that provide means of connection between output device 1640 and system bus 1618. It should be noted that other devices and/or systems of devices provide both input and output capabilities such as remote computer(s) 1644.

Computer 1612 can operate in a networked environment using logical connections to one or more remote computers, such as remote computer(s) 1644. Remote computer(s) 1644 can be a personal computer, a server, a router, a network PC, cloud storage, cloud service, a workstation, a microprocessor based appliance, a peer device, or other common network node and the like, and typically includes many or all of the elements described relative to computer 1612.

For purposes of brevity, only a memory storage device 1646 is illustrated with remote computer(s) 1644. Remote computer(s) 1644 is logically connected to computer 1612 through a network interface 1648 and then physically connected by way of communication connection 1650. Network interface 1648 encompasses wire and/or wireless communication networks such as local area networks and wide area networks. Local area network technologies include fiber distributed data interface, copper distributed data interface, Ethernet, Token Ring and the like. Wide area network technologies include, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1650 refer(s) to hardware/software employed to connect network interface 1648 to bus 1618. While communication connection 1650 is shown for illustrative clarity inside computer 1612, it can also be external to computer 1612. The hardware/software for connection to network interface 1648 can include, for example, internal and external technologies such as modems, including regular telephone grade modems, cable modems and digital subscriber line modems, integrated services digital network adapters, and Ethernet cards.

Figure 17:
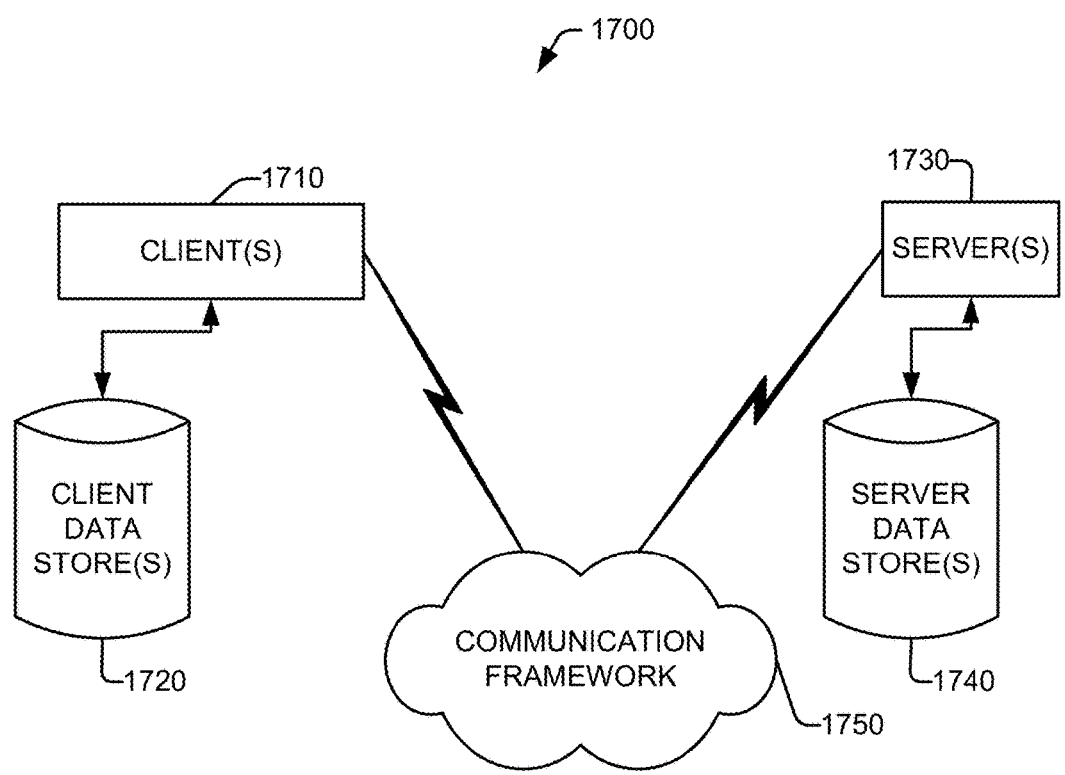
FIG. 17 is a schematic block diagram of an example computing environment.

FIG. 17 is a schematic block diagram of a sample-computing environment 1700 with which the subject matter of this disclosure can interact. The system 1700 includes one or more client(s) 1710. The client(s) 1710 can be hardware and/or software (e.g., threads, processes, computing devices). The system 1700 also includes one or more server(s) 1730. Thus, system 1700 can correspond to a two-tier client server model or a multi-tier model (e.g., client, middle tier server, data server), amongst other models. The server(s) 1730 can also be hardware and/or software (e.g., threads, processes, computing devices). The servers 1730 can house threads to perform transformations by employing this disclosure, for example. One possible communication between a client 1710 and a server 1730 may be in the form of a data packet transmitted between two or more computer processes.

The system 1700 includes a communication framework 1750 that can be employed to facilitate communications between the client(s) 1710 and the server(s) 1730. The client(s) 1710 are operatively connected to one or more client data store(s) 1720 that can be employed to store information local to the client(s) 1710. Similarly, the server(s) 1730 are operatively connected to one or more server data store(s) 1740 that can be employed to store information local to the servers 1730.

Figure 18:
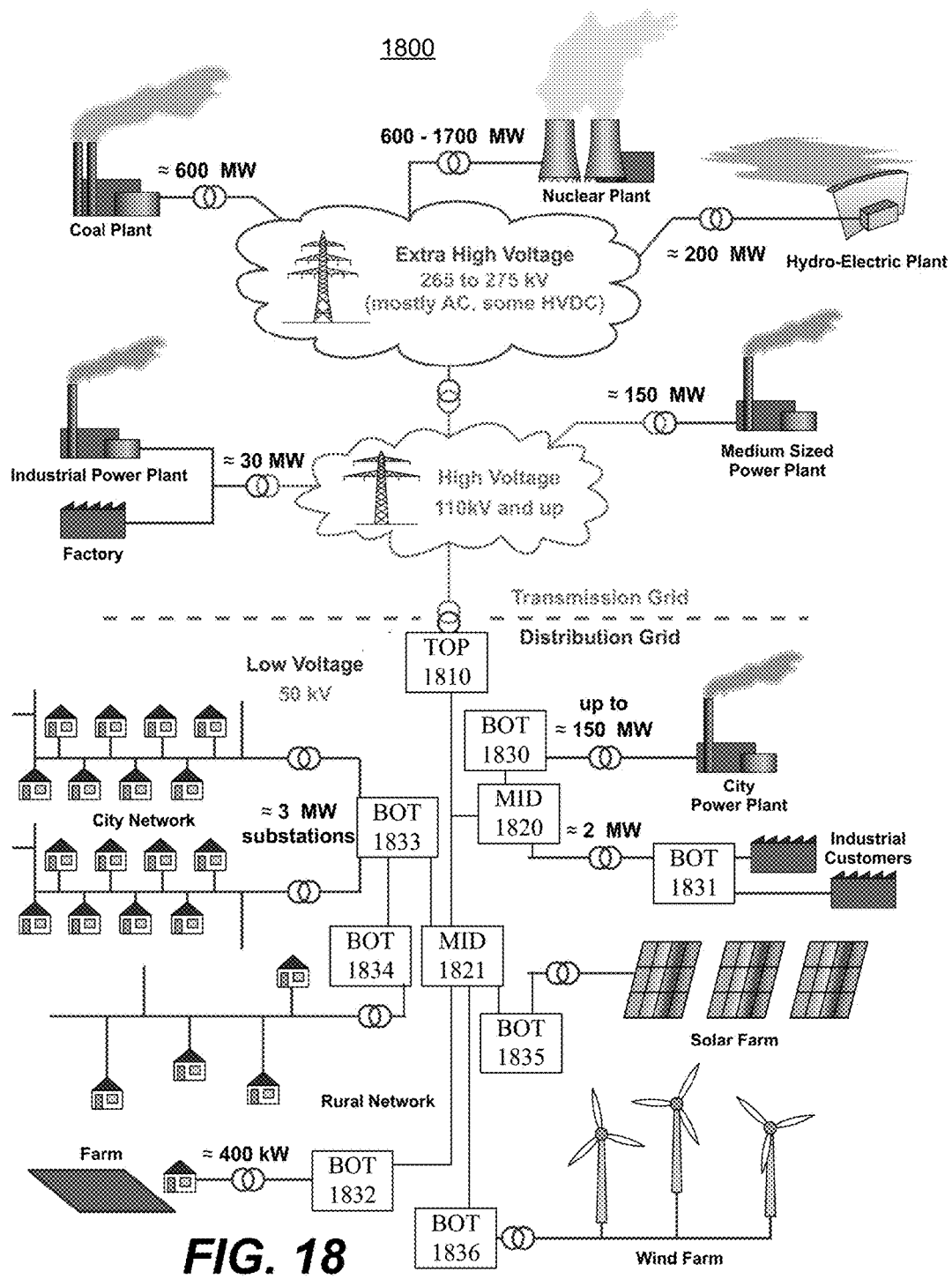
FIG. 18 depicts a diagram of an example electrical grid environment in which the various aspects of the disclosed subject matter may be practiced.

FIG. 18 depicts a diagram of an example electrical grid environment 1800 in which the various aspects of the disclosed subject matter can be practiced. It is to be appreciated that this figure and the associated disclosure is presented as a non-limiting example to facilitate a general comprehension of one or more aspects of the disclosed subject matter in connection with hypothetical electrical grid assets. Further, while sample values and assets are illustrated for context, these same sample values and assets are non-limiting and should not be viewed as defining any narrowing of scope. Generally, the assets of FIG. 18 can be assigned to a transmission grid portion (upper portion of figure) or a distribution grid portion (lower portion of figure) as is typical in many electrical power grids worldwide. Transmission systems often are associated with very high AC voltages or even DC transmission of power. Transmission systems are generally presented in the context of delivering high power to regional distribution networks managed by a distribution grid entity.

The conventional electrical distribution grid, as disclosed herein, generally has a flat control structure with control being centralized in a distribution control center (DCC). In contrast, as illustrated in FIG. 18, a non-flat control topography can be employed in accord with the subject matter disclosed herein. In this non-limiting example, three tiers of electrical distribution control system components are illustrated. A top-level (e.g., upper level) control node 1810 (also referred to as TOP 1810) (e.g., comprising a top-level DNNC component and top-level PSBC) can be communicatively coupled to junior level control nodes (e.g., 1820 to 1836), which can comprise junior level DNNC components and junior level PSBCs. In FIG. 18, the interconnections illustrate a basic tree structure topology.

In an aspect, two mid-level control nodes 1820 (also referred to as MID 1820) and 1821 (also referred to as MID 1821) can be logically placed between the bottom-level (e.g., lower level) control node and the top-level control node 1810. Further, the several bottom-level control nodes, such as bottom-level control nodes 1830 through 1836 (also referred to as BOT 1830 through BOT 1836), can be associated with various edge assets. For example, bottom-level control node 1830 can be associated with a city power plant and bottom-level control node 1831 can be associated with a small group of industrial customers. Bottom-level control node 1830 and 1831 can be logically connected to top-level control node 1810 by way of mid-level control node 1820. As such, data and rules can be bubbled up (e.g., communicated upward in the hierarchy) or pushed down (e.g., communicated downward in the hierarchy) by way of this communication path. The bidirectional communication and closed loop control at each level (e.g., top, mid, and bottom) can facilitate improved electrical distribution grid performance. For example, where additional power is requested by the industrial customers associated with bottom-level control node 1831, control signals from mid-level control node 1820 can source more power from city power plant by way of bottom-level control node 1830 without directly involving the top-level control node 1810 or draining energy from the illustrated solar farm or wind farm.

Similarly, mid-level control node 1821 can be associated with bottom-level control node 1832 through 1836. Bottom-level control node 1833, for example, can be logically associated with a plurality of transformers service a portion of a city network. Further, for example, bottom-level control node 1834 can be associated with a single transformer as part of a rural network. Moreover, at bottom-level control node 1832, for example, the control node can be associated with a single consumer, such as the farm. The control nodes also can be associated with distributed power generation, for example bottom-level control node 1835 associated with a solar farm and bottom-level control node 1836 associated with a wind farm. As such, bidirectional communication between top-level control node 1810 and bottom-level control node 1832 through 1836 can be by way of mid-level control node 1821. As such, rules propagated for mid-level control node 1820 and associate child control nodes can be different from rules propagated for mid-level control node 1821 and associated child control nodes. Further, independent closed loop control can be affected, for example, at bottom-level control node 1834 and the associated rural customers without impacting bottom-level control node 1833 and the associated city network.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects also may be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor also may be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

Further, the term "include" is intended to be employed as an open or inclusive term, rather than a closed or exclusive term. The term "include" can be substituted with the term "comprising" and is to be treated with similar scope, unless otherwise explicitly used otherwise. As an example, "a basket of fruit including an apple" is to be treated with the same breadth of scope as, "a basket of fruit comprising an apple."

Furthermore, the terms "user," "subscriber," "customer," "operator," "switchman," "consumer," "prosumer," "agent," and the like are employed interchangeably throughout the subject specification, unless context warrants particular distinction(s) among the terms. It should be appreciated that such terms can refer to human entities or automated components (e.g., supported through artificial intelligence, as through a capacity to make inferences based on complex mathematical formalisms), that can provide simulated vision, sound recognition and so forth.

What has been described above includes examples of systems and methods illustrative of the disclosed subject matter. It is, of course, not possible to describe every combination of components or methods herein. One of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A method, comprising:
    detecting, by a system comprising a processor, an islanding event in a power grid in operation that segregates the power grid into a main grid and one or more islands; and
    in response to the detecting the islanding event:
        performing a topological search of circuit breakers of the power grid,
        obtaining real-time measurement data from the power grid comprising voltage data, real power data, and frequency data,
        determining respective compositions of each island of the one or more islands based on the topological search and the measurement data,
        identifying at least one island resynchronization point based on the composition of each island, and the measurement data for each island of the power grid, wherein the at least one island resynchronization point relates to merging at least one island of the one or more islands with the main grid and
        outputting information corresponding to the at least one island resynchronization point.

2. The method of claim 1, wherein the performing the topological search comprises determining respective statuses of the circuit breakers.

3. The method of claim 1, wherein the obtaining the measurement data comprises processing phasor measurement unit data associated with the power grid.

4. The method of claim 1, wherein the detecting the islanding event comprises recognizing a bus topology change of one or more buses of the power grid.

5. The method of claim 4, wherein the recognizing the bus topology change comprises detecting a branch topology change of one or more branches of the power grid as result of opening at least one circuit-breaker of the circuit breakers coupled to a line component of the power grid or a transformer component of the power grid, and wherein the method further comprises tracking respective statuses of the at least one circuit-breaker.

6. The method of claim 4, wherein the one or more buses are two or more buses, and wherein the recognizing the bus topology change comprises detecting an opening of a circuit breaker of the circuit breakers connecting two of the two or more buses and further comprising tracking a status representing the opening of the circuit breaker.

7. The method of claim 1, wherein the identifying the at least one island resynchronization point comprises processing circuit-breaker open status information, voltage difference data between islands and frequency difference data between islands to identify the at least one island resynchronization point.

8. The method of claim 1, wherein the outputting the information corresponding to the at least one island resynchronization point comprises outputting at least one suggested resynchronization action via an application program.

9. The method of claim 8, wherein the outputting of the at least one suggested resynchronization action comprises generating a recommendation to close at least one circuit breaker.

10. The method of claim 1, wherein the outputting the information corresponding to the at least one island resynchronization point comprises outputting at least one suggested merging action for resynchronization of at least one island of the one or more islands.

11. The method of claim 10, wherein the outputting of the at least one suggested merging action comprises generating a recommendation to close at least one circuit breaker.

12. The method of claim 1, further comprising outputting islanding event cause information and islanding event location information via an application program.

13. The method of claim 1, further comprising outputting island size data and island frequency data for at least one island of the group of islands via an application program.

14. A system, comprising:
a memory to store computer-executable components; and
a processor, coupled to the memory, that executes or facilitates execution of computer-executable components, the computer-executable components comprising:
island management logic
configured to:
detect an islanding event in a power grid in operation that segregates the power grid into a main grid and one or more islands;
in response to the islanding event being detected:
perform a topological search of circuit breakers of the power grid,
obtain real-time measurement data from the power grid comprising voltage data, real power data, and frequency data,
determine respective compositions of the at least one island based on the topological search and the measurement data;
identify at least one island resynchronization point based on the respective compositions, and the measurement data for each island of the power grid, wherein the at least one island resynchronization point relates to merging at least one island of the one or more islands with the main grid; and
output information corresponding to the at least one island resynchronization point.

15. The system of claim 14, wherein the island management logic is further configured to process the measurement data to identify the at least one island resynchronization point.

16. The system of claim 14, wherein the island management logic is further configured to recognize an opening of at least one circuit-breaker related to the islanding event.

17. The system of claim 14, wherein the island management logic is further configured to output at least one suggested resynchronization action relating to the at least one island resynchronization point via an application.

18. A non-transitory computer readable storage medium, comprising executable instructions that, when executed on a processor, facilitate performance of operations comprising:
in response to a detection of an islanding event in a power grid in operation that segregates the power grid into a main grid and one or more islands:
performing a topological search of circuit breakers of the power grid,
obtaining real-time measurement data from the power grid comprising voltage data, real power data, and frequency data,
determining respective compositions of each island of the one or more islands based on the topological search and the measurement data,
identifying at least one island resynchronization point based on the composition of each island, and the measurement data for each island of the power grid, wherein the at least one island resynchronization point relates to merging at least one island of the one or more islands with the main grid, and
outputting a suggested resynchronization action corresponding to the resynchronization point to an output of an application program.

19. The non-transitory computer readable storage medium of claim 18, wherein the performing the topological search comprises determining respective statuses of the circuit breakers.

20. The non-transitory computer readable storage medium of claim 18, wherein the operations further comprise, outputting, to an application program for inclusion in a rendering by the application program, islanding event cause information, islanding event location information, island size data and island frequency data for an island of the one or more islands.

* * * * *